United States Patent
Kamakura et al.

(10) Patent No.: US 10,784,116 B2
(45) Date of Patent: Sep. 22, 2020

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Tsukasa Kamakura, Toyama (JP); Koei Kuribayashi, Toyama (JP); Daigo Yamaguchi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/922,500

(22) Filed: Mar. 15, 2018

(65) Prior Publication Data

US 2018/0204732 A1 Jul. 19, 2018

Related U.S. Application Data

(63) Continuation of application No. PCT/JP2015/076526, filed on Sep. 17, 2015.

(51) Int. Cl.
*H01L 21/31* (2006.01)
*C23C 16/455* (2006.01)
(Continued)

(52) U.S. Cl.
CPC ............ *H01L 21/31* (2013.01); *C23C 16/325* (2013.01); *C23C 16/401* (2013.01); *C23C 16/4401* (2013.01); *C23C 16/455* (2013.01); *C23C 16/45534* (2013.01); *H01L 21/0228* (2013.01); *H01L 21/02126* (2013.01); *H01L 21/02131* (2013.01); *H01L 21/02211* (2013.01); *H01L 21/02321* (2013.01); *H01L 21/02337* (2013.01); *H01L 21/768* (2013.01); *H01L 23/532* (2013.01)

(58) Field of Classification Search
CPC .......... H01L 23/5329; H01L 21/02126; H01L 21/02274; H01L 21/31633; H01L 21/31604; H01L 21/31629
USPC ........................................ 438/758, 778, 787
See application file for complete search history.

(56) References Cited

U.S. PATENT DOCUMENTS

2003/0201465 A1 10/2003 Ryuzaki et al.
2006/0223306 A1 10/2006 Kawamura et al.
(Continued)

FOREIGN PATENT DOCUMENTS

JP 10-150036 A 6/1998
JP 2002-280382 A 9/2002
(Continued)

OTHER PUBLICATIONS

International Search Report dated Dec. 8, 2015 of PCT International Application No. PCT/JP2015/076526.
(Continued)

*Primary Examiner* — S. V. Clark
(74) *Attorney, Agent, or Firm* — Volpe and Koenig, P.C.

(57) ABSTRACT

There is provided a technique that includes: (a) providing a substrate having a film containing a predetermined element, oxygen and carbon formed on a surface of the substrate; and (b) modifying at least a surface of the film by supplying a carbon-free fluorine-based gas to the substrate under a condition in which etching of the film does not occur.

17 Claims, 13 Drawing Sheets

(51) Int. Cl.
*H01L 21/02* (2006.01)
*C23C 16/32* (2006.01)
*C23C 16/40* (2006.01)
*H01L 23/532* (2006.01)
*H01L 21/768* (2006.01)
*C23C 16/44* (2006.01)

(56) References Cited

U.S. PATENT DOCUMENTS

| | | | | |
|---|---|---|---|---|
| 2009/0184315 | A1* | 7/2009 | Lee | H01L 27/1296 257/43 |
| 2009/0280653 | A1* | 11/2009 | Ang | C23C 16/30 438/765 |
| 2010/0317188 | A1* | 12/2010 | Nishizawa | C23C 16/26 438/643 |
| 2014/0287596 | A1 | 9/2014 | Hirose et al. | |

FOREIGN PATENT DOCUMENTS

| | | |
|---|---|---|
| JP | 2003-309173 A | 10/2003 |
| JP | 2005-064302 A | 3/2005 |
| JP | 2014-183218 A | 9/2014 |
| KR | 10-2014-0114761 A | 9/2014 |

OTHER PUBLICATIONS

Korean Office Action dated Feb. 15, 2019 for the Korean Patent Application No. 10-2018-7006121.
Japanese Office Action dated Sep. 12, 2018 for the Japanese Patent Application No. 2017-540419.

* cited by examiner

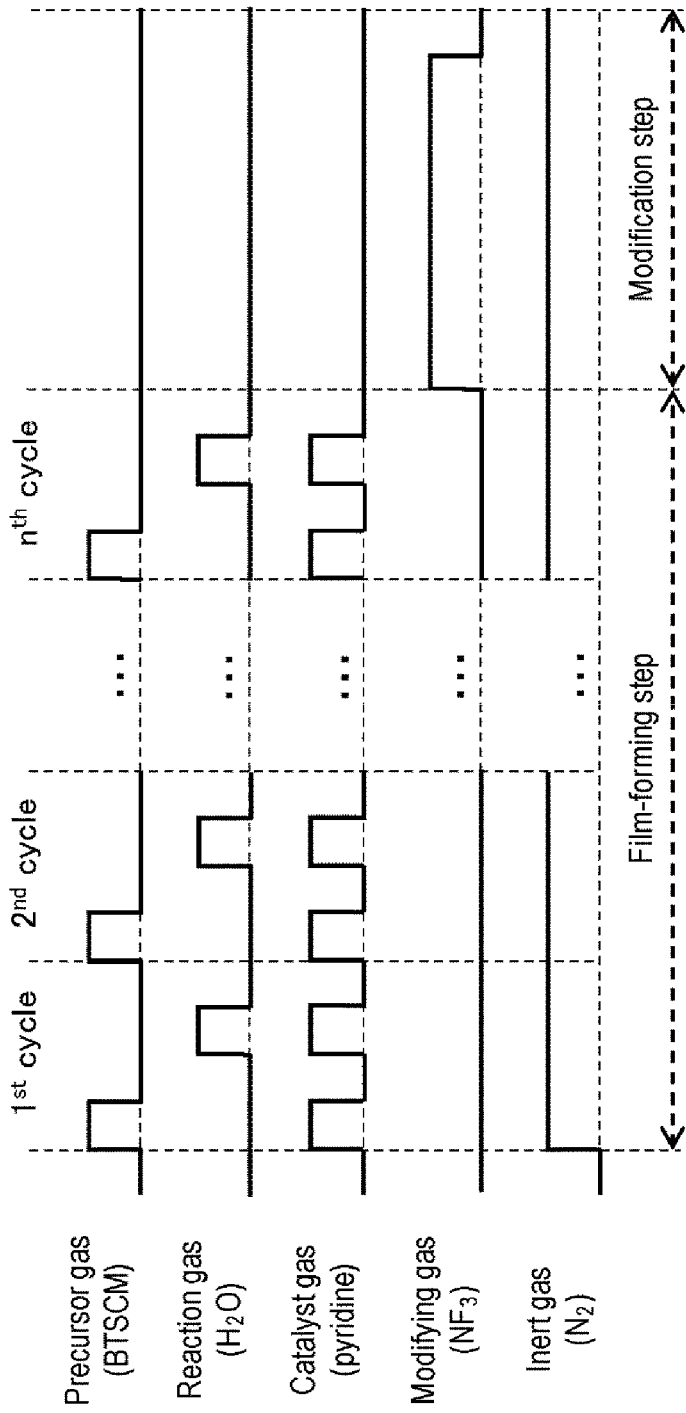

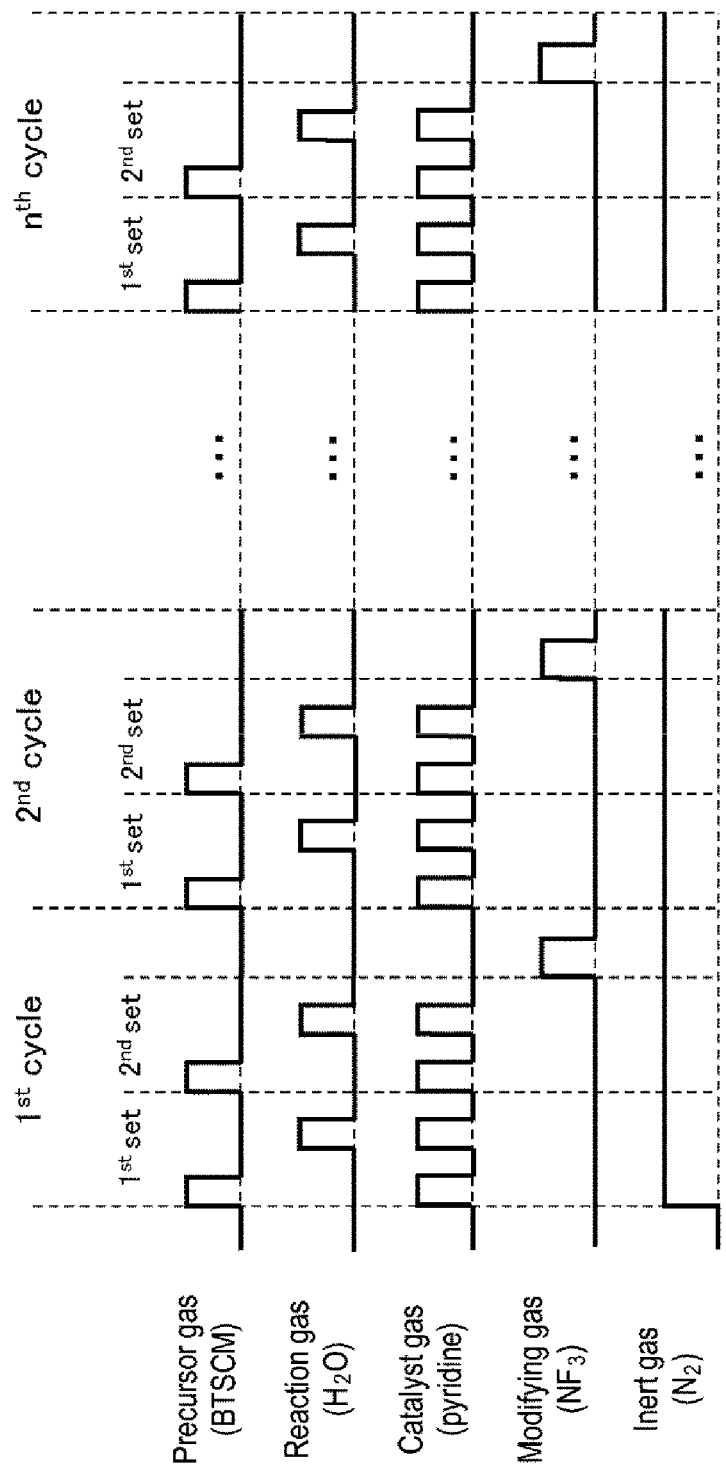

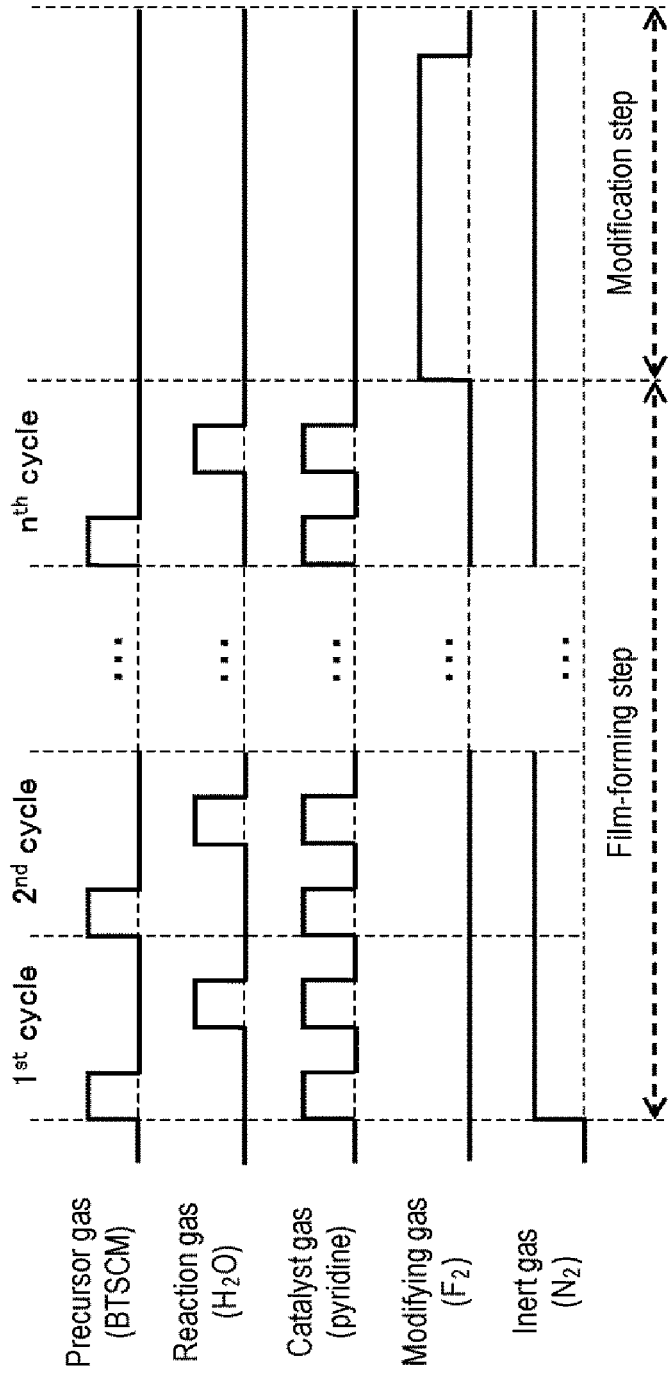

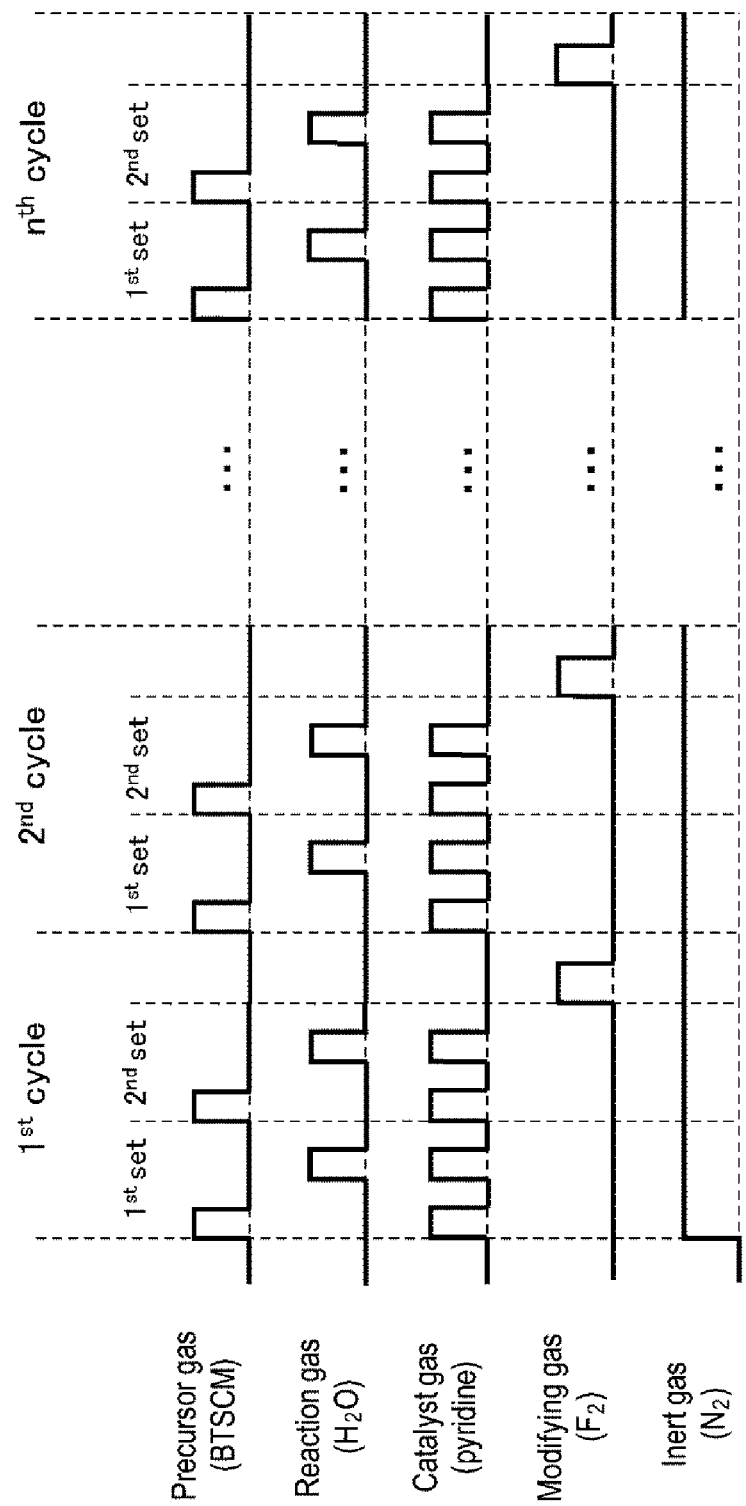

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT international Application No. PCT/JP2015/076526, filed on Sep. 17, 2015, the entire content of which is incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a film-forming process of forming a film on a substrate is often carried out.

SUMMARY

Some embodiments of the present disclosure provide a technique capable of improving a quality of a film formed on a substrate.

According to one embodiment of the present disclosure, there is provided a method of manufacturing a semiconductor device, including: (a) providing a substrate having a film containing a predetermined element, oxygen and carbon formed on a surface of the substrate; and (b) modifying at least a surface of the film by supplying a carbon-free fluorine-based gas to the substrate under a condition in which etching of the film does not occur.

BRIEF DESCRIPTION OF DRAWINGS

FIG. 4A is a diagram illustrating a film-forming sequence according to a first embodiment of the present disclosure, and FIG. 4B is a diagram illustrating a film-forming sequence according to another embodiment of the present disclosure.

FIG. 5A is a diagram illustrating a film-forming sequence according to a second embodiment of the present disclosure, and FIG. 5B is a diagram illustrating a film-forming sequence according to another embodiment of the present disclosure.

DETAILED DESCRIPTION

First Embodiment

A first embodiment of the present disclosure will be described as below with reference to FIGS. 1 to 3.

(1) Configuration of the Substrate Processing Apparatus

Figure 1:
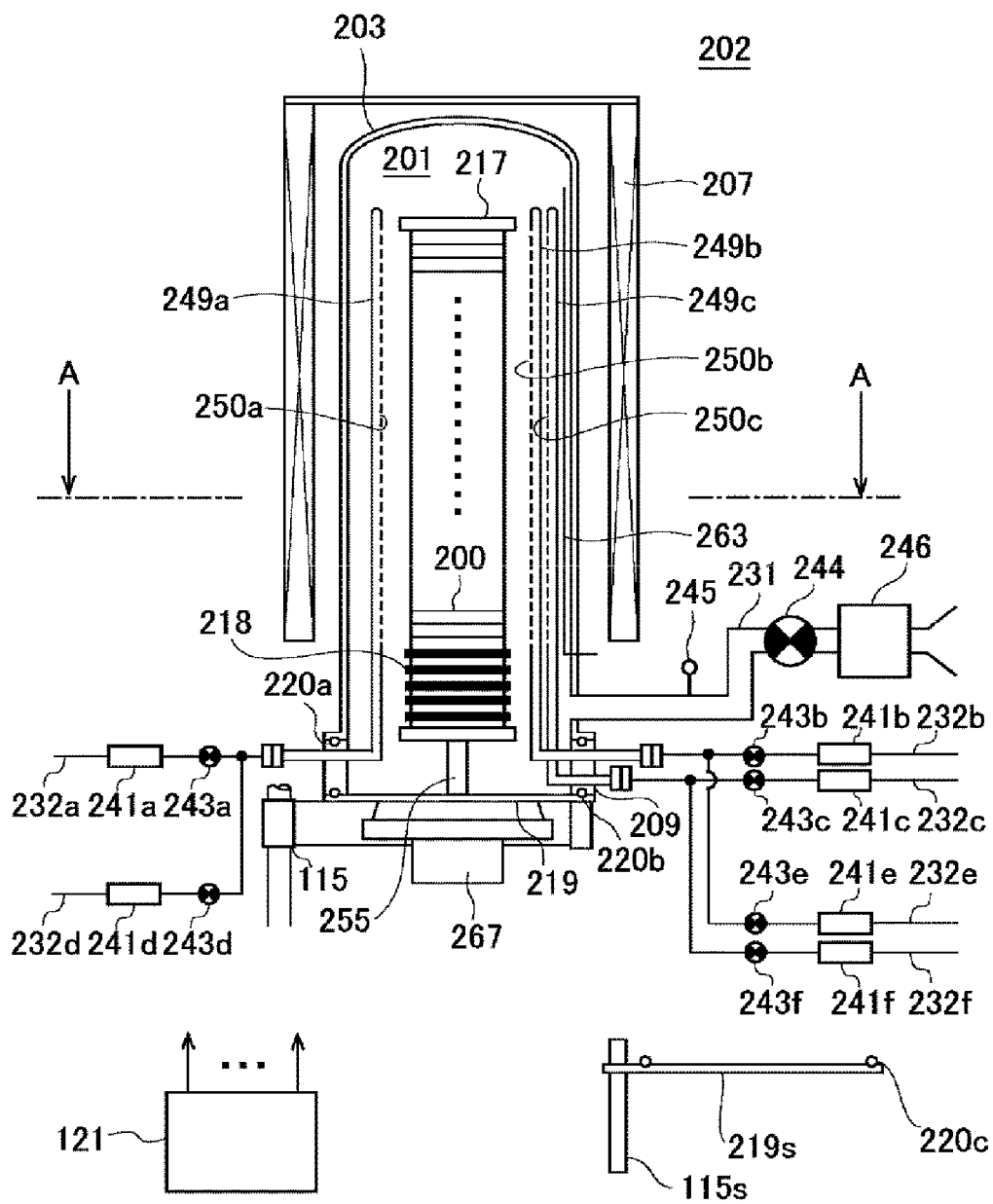
FIG. 1 is a schematic configuration diagram of a vertical type processing furnace of a substrate processing apparatus suitably used in an embodiment of the present disclosure, in which a portion of the processing furnace is shown in a vertical cross sectional view.
Figure 2:
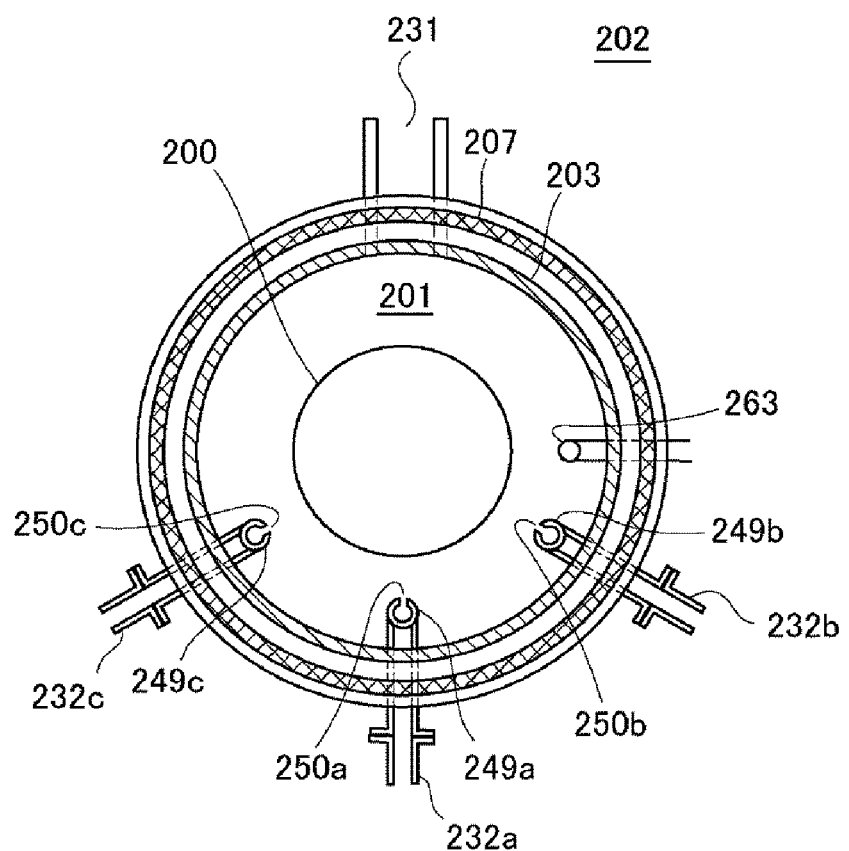
FIG. 2 is a schematic configuration diagram of a portion of the vertical type processing furnace of the substrate processing apparatus suitably used in an embodiment of the present disclosure, in which the portion of the processing furnace is shown in a cross sectional view taken along line A-A in FIG. 1.

As illustrated in FIG. 1, a processing furnace 202 includes a heater 207 as a heating means (heating mechanism). The heater 207 has a cylindrical shape and is supported by a heater base (not shown) serving as a holding plate so as to be vertically installed. As will be described hereinbelow, the heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material such as, e.g., quartz ($SiO_2$), silicon carbide (SiC) or the like and has a cylindrical shape with its upper end closed and its lower end opened. A manifold (inlet flange) 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. The manifold 209 is supported by the heater base, so that the reaction tube 203 is in a vertically mounted state. A processing vessel (reaction vessel) is mainly configured by the reaction tube 203 and the manifold 209. A process chamber 201 is formed in a hollow cylindrical portion of the processing vessel. The process chamber 201 is configured to accommodate wafers 200 as a plurality of substrates in a state in which the wafers 200 are arranged in a horizontal posture and in multiple stages along a vertical direction in a boat 217 which will be described hereinbelow.

Nozzles 249a to 249c are installed in the process chamber 201 so as to penetrate the manifold 209. The nozzles 249a to 249c are made of a heat resistant material such as quartz, SiC or the like. Gas supply pipes 232a to 232c are respectively connected to the nozzles 249a to 249c. In this way, three nozzles 249a to 249c and three gas supply pipes 232a to 232c are installed in the processing vessel (manifold 209) to be capable of supplying plural types of gases into the process chamber 201.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides, respectively. Gas supply pipes 232d to 232f, which supply an inert gas, are respectively connected to the gas supply pipes 232a to 232c at the downstream side of the valves 243a to 243c. MFCs 241d to 241f, which are flow rate controllers (flow rate control parts), and valves 243d to 243f, which are opening/closing valves, are respectively installed in the gas supply pipes 232d to 232f sequentially from the corresponding upstream sides.

The nozzles 249a to 249c are connected to front end portions of the gas supply pipes 232a to 232c, respectively. As illustrated in FIG. 2, the respective nozzles 249a to 249c are disposed in a space having an annular shape in a plan view between the inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the respective nozzles 249a to 249c are installed at a lateral side of a wafer arrangement region in which the wafers 200 are arranged, namely in a region which horizontally surrounds the wafer arrangement region, so as to extend along the wafer arrangement region. That is, the respective nozzles 249a to 249c are located at a lateral side of the end portions (peripheral edge portions) of the wafers 200 which are carried into the process chamber 201, in a perpendicular relationship with the surfaces (flat surfaces) of the wafers 200. The nozzles 249a to 249c are respectively configured as L-shaped nozzles. A horizontal portion of each of the nozzles 249a to 249c penetrates a sidewall of the manifold 209. A vertical portion of each of the nozzles 249a to 249c extends upward at least from one end portion of the wafer arrangement region toward the other end portion of the wafer arrangement region. Gas supply holes 250a to 250c for supplying a gas are located on the side surfaces of the nozzles 249a to 249c, respectively. The gas supply holes 250a to 250c are opened toward the center of the reaction tube 203 so as to allow a gas to be supplied toward the wafers 200. There may be a plurality of respective gas supply holes 250a to 250c between the lower portion of the reaction tube 203 and the upper portion of the reaction tube 203. The respective gas supply holes 250a to 250c may have the same aperture area and may be formed at the same aperture pitch.

As described above, in the present embodiment, a gas is transferred through the nozzles 249a to 249c, which are disposed in a vertically-elongated space having an annular shape in a plan view, i.e., a cylindrical space, defined by the inner wall of the reaction tube 203 and the end portions of the wafers 200 arranged within the reaction tube 203. The gas is initially discharged into the reaction tube 203, near the wafers 200, from opened gas supply holes 250a to 250c located in the nozzles 249a to 249c. The gas within the reaction tube 203 mainly flows in a direction parallel to surfaces of the wafers 200, i.e., in a horizontal direction. With this configuration, the gas can be uniformly supplied to the respective wafers 200. This makes it possible to improve the uniformity in the thickness of a film formed on each of the wafers 200. In addition, the gas flowing on the surfaces of the wafers 200, i.e., the residual gas after the reaction, flows toward an exhaust port, i.e., an exhaust pipe 231 which will be described later. The flow direction of the residual gas is not limited to a vertical direction but may be appropriately specified depending on a position of the exhaust port.

As a precursor gas containing a predetermined element, for example, a halosilane precursor gas, which contains Si as a predetermined element and a halogen element, is supplied from the gas supply pipe 232a into the process chamber 201 via the WC 241a, the valve 243a and the nozzle 249a.

The precursor gas refers to a gaseous precursor, for example, a gas obtained by vaporizing a liquid precursor which remains in a liquid state under room temperature and atmospheric pressure, or a precursor which remains in a gas state under room temperature and atmospheric pressure. The halosilane precursor is a silane precursor having a halogen group. The halogen group includes a chloro group, a fluoro group, a bromo group, an iodo group, and the like. That is, the halogen group contains a halogen element such as chlorine (Cl), fluorine (F), bromine (Br), iodine (I) or the like. The halosilane precursor may be said to be a kind of halide. When the term "precursor" is used herein, it may refer to "a precursor staying in a liquid state," "a precursor (precursor gas) staying in a gaseous state," or both.

As the halosilane precursor gas, it may be possible to use, for example, a precursor gas which contains Si, Cl and an alkylene group and which has an Si—C bond, i.e., an alkylene chlorosilane precursor gas which is an organic chlorosilane precursor gas. The alkylene group includes a methylene group, an ethylene group, a propylene group, a butylene group, and the like. The alkylene chlorosilane precursor gas may also be referred to as an alkylene halosilane precursor gas. As the alkylene chlorosilane precursor gas, it may be possible to use, for example, a bis (trichlorosilyl) methane (($SiCl_3)_2CH_2$, abbreviation: BTCSM) gas, an ethylene bis (trichlorosilane) gas, i.e., a 1,2-bis (trichlorosilyl) ethane (($SiCl_3)_2C_2H_4$, abbreviation: BTCSE) gas, or the like. These gases may also be said to be a precursor gas which contains at least two Si atoms in one molecule, which contains C and Cl, and which has an Si—C bond. These gases act as an Si source or as a C source in a film-forming process which will be described later.

In addition, as the halosilane precursor gas, it may be possible to use, for example, a precursor gas which contains Si, Cl and an alkyl group and which has an Si—C bond, i.e., an alkylchlorosilane precursor gas which is an organic chlorosilane precursor gas. The alkyl group includes a methyl group, an ethyl group, a propyl group, a butyl group, and the like. The alkylchlorosilane precursor gas may also be referred to as an alkylhalosilane precursor gas. As the alkylchlorosilane precursor gas, it may be possible to use, for example, a 1,1,2,2-tetrachloro-1,2-dimethyldisilane (($CH_3)_2Si_2Cl_4$, abbreviation: TCDMDS) gas, a 1,2-dichloro-1,1,2,2-tetramethyldisilane (($CH_3)_4Si_2Cl_2$, abbreviation: DCTMDS) gas, a 1-monochloro-1,1,2,2,2-pentamethyldisilane (($CH_3)_5Si_2Cl$, abbreviation MCPMDS) gas, or the like. These gases may be said to be a precursor gas which contains at least two Si atoms in one molecule, which contains C and Cl, and which has an Si—C bond. These gases also have an Si—Si bond. These gases act as an Si source or as a C source in the film-forming process as described hereinbelow.

Furthermore, as the halosilane precursor gas, it may be possible to use, for example, a C-free precursor gas containing Si and Cl, i.e., an inorganic chlorosilane precursor gas. As the inorganic chlorosilane precursor gas, it may be possible to use, for example, a hexachlorodisilane ($Si_2Cl_6$: abbreviation: HCDS) gas or an octachlorotrisilane ($Si_3Cl_8$, abbreviation: OCTS) gas, or the like. These gases may also be said to be a precursor gas which contains at least two Si atoms in one molecule, which contains Cl, and which has an Si—Si bond. These gases act as an Si source in the film-forming process as described hereinbelow.

In the case of using a liquid precursor such as BTCSM, TCDMDS, HCDS, or the like which stays in a liquid state under room temperature and atmospheric pressure, the precursor of a liquid state is vaporized by a vaporization system such as a vaporizer, a bubbler or the like and is supplied as a precursor gas.

A gas containing an OH group (hydroxy group) as a reaction gas (reactant) having a chemical structure different from that of the precursor gas, is supplied from the gas supply pipe 232b into the process chamber 201 via the MFC 241b, the valve 243b and the nozzle 249b. The gas containing an OH group acts as an oxidizing agent (oxidizing gas), i.e., an O source, in the film-forming process described hereinbelow. As the gas containing an OH group, it may be possible to use, for example, water vapor ($H_2O$ gas). For example, reverse osmosis (RO) water from which an impurity is removed by using a reverse osmosis film, pure water (or ultrapure water) such as deionized water from which an impurity is removed by performing a deionization process, or distilled water from which an impurity is removed by distillation using a distiller is vaporized by a vaporization system such as a vaporizer, a bubbler, a boiler or the like and is supplied as a gas containing an OH group ($H_2O$ gas).

A catalyst gas for promoting a film formation reaction with the aforementioned precursor gas or reaction gas is supplied from the gas supply pipe 232c into the process chamber 201 via the MFC 241c, the valve 243c and the nozzle 249c. As the catalyst gas, it may be possible to use, for example, an amine-based gas containing C, N and H.

The amine-based gas is a gas containing an amine in which at least one of H atoms in ammonia ($NH_3$) is substituted by a hydrocarbon group such as an alkyl group or the like. An amine which contains N having a lone pair of electrons and which has an acid dissociation constant (hereinafter, also referred to as pKa) of, for example, about 5 to 11, may be appropriately used as a catalyst. The acid dissociation constant pKa is one of the indicators quantitatively indicating the strength of an acid, which is expressed by negative common logarithm of the equilibrium constant Ka in a dissociation reaction in which H ions are released from the acid. As the amine-based gas, it may be possible to use a cyclic amine-based gas having a cyclic hydrocarbon group, or a chain amine-based gas having a chain hydrocarbon group.

As the cyclic amine-based gas, it may be possible to use, for example, a pyridine ($C_5H_5N$, pKa=5.67) gas, an aminopyridine ($C_5H_6N_2$, pKa=6.89) gas, a picoline ($C_6H_7N$, pKa=6.07) gas, a lutidine ($C_7H_9N$, pKa=6.96) gas, a piperazine ($C_4H_{10}N_2$, pKa=9.80) gas, a piperidine ($C_5H_{11}N$, pKa=11.12) gas, or the like. The cyclic amine-based gas may also be said to be a heterocyclic compound whose cyclic structure is composed of plural types of elements of C and N, i.e., a nitrogen-containing heterocyclic compound.

As the chain amine-based gas, it may be possible to use, for example, a triethylamine (($C_2H_5)_3N$, abbreviation: TEA, pKa=10.7) gas, a diethylamine (($C_2H_5)_2NH$), abbreviation: DEA, pKa=10.9) gas, a monoethylamine ($C_2H_5NH_2$, abbreviation: MEA, pKa=10.6) gas, a trimethylamine ($(CH_3)_3N$, abbreviation: TMA, pKa=9.8) gas, a monomethylamine ($CH_3NH_2$, abbreviation: MMA, pKa=10.6) gas, or the like.

The amine-based gas acting as a catalyst may also be referred to as an amine-based catalyst or an amine-based catalyst gas. As the catalyst gas, it may also be possible to use, other than the amine-based gases described above, a non-amine-based gas, for example, an ammonia ($NH_3$, pKa=9.2) gas, or the like.

Furthermore, in the catalyst illustrated herein, a portion of the molecular structure may be decomposed in the film-forming process described hereinbelow. A substance which partially changes before and after the chemical reaction in this way is not strictly a "catalyst". However, in the present disclosure, even when a portion of the molecular structure is decomposed in the process of the chemical reaction, a substance whose molecular structure is not mostly decomposed and which changes the reaction rate and acts substantially as a catalyst is referred to as a "catalyst".

A fluorine (F)-based gas as a modifying gas is supplied from the gas supply pipe 232a into the process chamber 201 via the MFC 241a, the valve 243a, and the nozzle 249a. The fluorine-based gas acts as a fluoride gas, i.e., an F source, by appropriately controlling the conditions of a modification process which will be described later. As the fluorine-based gas, it may be possible to use, for example, a nitrogen fluoride ($NF_3$) gas or a fluorine ($F_2$) gas. The $NF_3$ gas and the $F_2$ gas are C-free F-containing gases.

An inert gas, for example, a nitrogen ($N_2$) gas, is supplied from the gas supply pipes 232d to 232f into the process chamber 201 via the MFCs 241d to 241f, the valves 243d to 243f, the gas supply pipes 232a to 232c, and the nozzles 249a to 249c.

In the case where the aforementioned precursor gas is supplied from the gas supply pipe 232a, a precursor gas supply system is mainly configured by the gas supply pipe 232a, the MFC 241a, and the valve 243a. The nozzle 249a may be regarded as being included in the precursor gas supply system. The precursor gas supply system may also be referred to as a precursor supply system. When the halosilane precursor gas is supplied from the gas supply pipe 232a, the precursor gas supply system may also be referred to as a halosilane precursor gas supply system or a halosilane precursor supply system.

In the case where the aforementioned reaction gas is supplied from the gas supply pipe 232b, a reaction gas supply system is mainly configured by the gas supply pipe 232b, the MFC 241b, and the valve 243b. The nozzle 249b may be regarded as being included in the reaction gas supply system. The reaction gas supply system may also be referred to as a reactant supply system. In the case where the gas containing an OH group is supplied from the gas supply pipe 232b, the reaction gas supply system may also be referred to as an OH group-containing gas supply system, an O-containing gas supply system, an oxidant supply system, or an oxidizing gas supply system.

In the case where the aforementioned catalyst gas is supplied from the gas supply pipe 232c, a catalyst gas supply system is mainly configured by the gas supply pipe 232c, the MFC 241c, and the valve 243c. The nozzle 249c may be regarded as being included in the catalyst gas supply system. The catalyst gas supply system may also be referred to as a catalyst supply system. In the case where the amine-based gas is supplied from the gas supply pipe 232c, the catalyst gas supply system may also be referred to as an amine-based catalyst gas supply system, an amine-based gas supply system, or an amine supply system.

In the case where the aforementioned modifying gas is supplied from the gas supply pipe 232a, a modifying gas supply system is mainly configured by the gas supply pipe 232a, the MFC 241a, and the valve 243a. The nozzle 249a may be regarded as being included in the modifying gas supply system. In the case where the aforementioned fluorine-based gas is supplied from the gas supply pipe 232a, the modifying gas supply system may be referred to as a fluorine-based gas supply system, a fluoride gas supply system, or an F-containing gas supply system.

In addition, an inert gas supply system is mainly configured by the gas supply pipes 232d to 232f, the MFCs 241d to 241f, and the valves 243d to 243f.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is a valve configured such that the vacuum exhaust of the interior of the process chamber 201 and the vacuum exhaust stop can be performed by opening and closing the APC valve 244 while operating the vacuum pump 246 and such that the internal pressure of the process chamber 201 can be adjusted by adjusting the opening degree of the APC valve 243 based on the pressure information detected by the pressure sensor 245 while operating the vacuum pump 246. An exhaust system is mainly configured by the exhaust pipe 231, the APC valve 244 and the pressure sensor 245. The vacuum pump 246 may be regarded as being included in the exhaust system.

A seal cap 219, which serves as a furnace opening cover configured to air-tightly seal a lower end opening of the manifold 209, is installed below the manifold 209. The seal cap 219 is configured to make contact with the lower end of the manifold 209 at a lower side in the vertical direction. The seal cap 219 is made of metal such as, e.g., stainless steel or the like, and is formed in a disc shape. An O-ring 220b, which is a seal member making contact with the lower end portion of the manifold 209, is installed on an upper surface of the seal cap 219. A rotation mechanism 267 configured to rotate the boat 217, which will be described later, is installed at the opposite side of the seal cap 219 from the process chamber 201. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219s as a furnace opening cover capable of air-tightly sealing the lower end opening of the manifold 209 while moving the seal cap 219 down with the boat elevator 115 is installed below the manifold 209. The shutter 219s is made of metal such as, e.g., stainless steel or the like, and is formed in a disc shape. An O-ring 220c as a seal member making contact with the lower end portion of the manifold 209 is installed on an upper surface of the shutter 219s. An opening/closing operation (elevating operation or rotating operation) of the shutter 219s is controlled by a shutter opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages. With this configuration, it is hard for heat generated from the heater 207 to be transferred to the seal cap 219. However, the present embodiment is not limited to this configuration. For example, instead of installing the heat insulating plates 218 below the boat 217, a heat insulating tube as a tubular member made of a heat resistant material such as quartz or SiC may be installed under the boat 217.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. Similar to the nozzles 249a to 249c, the temperature sensor 263 is formed in an L shape. The temperature sensor 263 is installed along the inner wall of the reaction tube 203.

Figure 3:
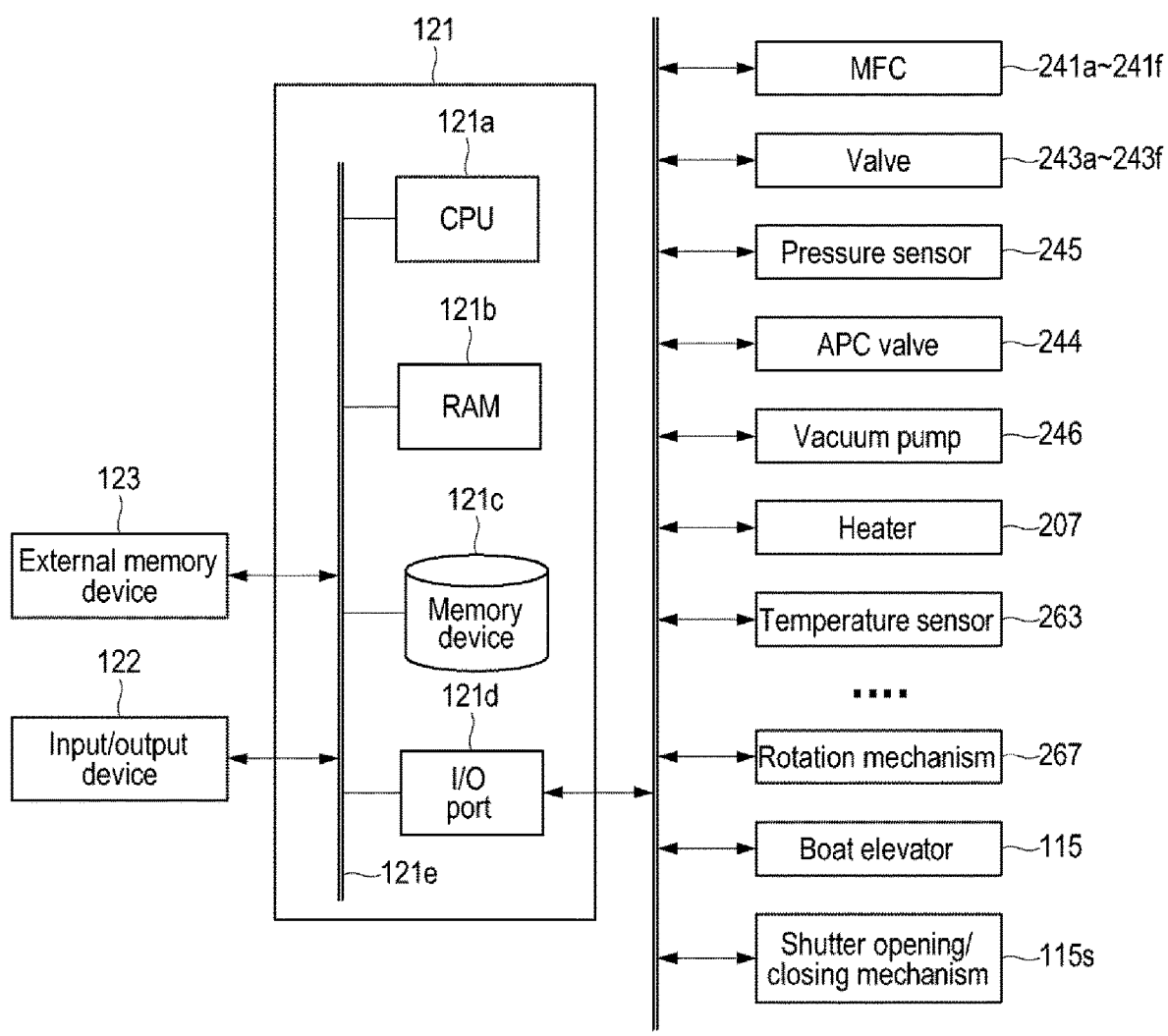
FIG. 3 is a schematic configuration diagram of a controller of the substrate processing apparatus suitably used in an embodiment of the present disclosure, in which a control system of the controller is shown in a block diagram.

As illustrated in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing process, as described hereinbelow, to obtain a predetermined result. Hereinafter, the process recipe and the control program will be collectively and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the heater 207, the temperature sensor 263, the rotation mechanism 267, the boat elevator 115, the shutter opening/closing mechanism 115s, and the like, as described above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241f, the opening/closing operation of the valves 243a to 243f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 and rotation speed adjusting operation with the rotation mechanism 267, the operation of moving the boat 217 up and down with the boat elevator 115, the operation of opening and closing the shutter 219s with the shutter opening/closing mechanism 115s, and the like.

The controller 121 may be configured by installing, on the computer, the aforementioned program stored in an external memory device 123 (for example, a magnetic tape, a magnetic disk such as a flexible disk or a hard disk, an optical disc such as a CD or DVD, a magneto-optical disc such as an MO, or a semiconductor memory such as a USB memory or a memory card). The memory device 121c or the external memory device 123 is configured as a computer-readable recording medium. Hereinafter, the memory device 121c and the external memory device 123 will be collectively and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing Process

A sequence example of forming a film on a substrate using the aforementioned substrate processing apparatus, which is one of the processes for manufacturing a semiconductor device, will be described below with reference to FIG. 4A. In the following descriptions, the operations of the respective parts constituting the substrate processing apparatus are controlled by the controller 121.

In the film-forming sequence illustrated in FIG. 4A, a film-forming step of forming a film on a wafer 200 and a modification step of modifying the film formed on the wafer 200 are performed.

At the film-forming step illustrated in FIG. 4A, a silicon oxycarbide film (SiOC film) as a film containing Si, O and C is formed on the wafer 200 by performing a cycle a predetermined number of times (once or more), the cycle including non-simultaneously, i.e., non-synchronously, and alternately performing: a step 1 of supplying a BTCSM gas as a precursor gas and a pyridine gas as a catalyst gas to the wafer 200; and a step 2 of supplying an $H_2O$ gas as a reaction gas and a pyridine gas as a catalyst gas to the wafer 200 is implemented.

At the modification step illustrated in FIG. 4A, an $NF_3$ gas is supplied as a C-free fluorine-based gas to the wafer 200 to modify at least the surface of the SiOC film under a condition in which etching of the SiOC film formed on the wafer 200 does not occur. The modification step illustrated in FIG. 4A shows that F is added (doped) into the entire region of the SiOC film formed on the wafer 200 to modify the entire SiOC film into a film containing Si, O, C and F, i.e., a silicon oxycarbonate fluoride film (SiOCF film). The SiOCF film may also be referred to as an F-containing SiOC film or an F-added (doped) SiOC film.

In the present disclosure, for the sake of convenience, a series of sequences illustrated in FIG. 4A may sometimes be denoted as follows. The same denotation will be used in other embodiments as described hereinbelow.

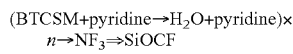

When the term "wafer" is used herein, it may refer to "a wafer itself" or "a laminated body (aggregate) of a wafer and a predetermined layer or film formed on the surface of the wafer". That is, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer, namely an uppermost surface of the wafer as a laminated body".

Accordingly, in the present disclosure, the expression "a predetermined gas is supplied to a wafer" may mean that "a predetermined gas is directly supplied to a surface (exposed surface) of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Loading Step)

If a plurality of wafers 200 is charged on the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The vacuum pump 246 may continuously operate at least until the processing of the wafers 200 is completed. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 begins. The rotation of the boat 217 and the wafers 200 by the rotation mechanism 267 may be continuously performed at least until the processing of the wafers 200 is completed.

(Film-Forming Step)

Next, the following two steps, i.e., steps 1 and 2, are sequentially performed.

[Step 1]

At this step, a BTCSM gas and a pyridine gas are supplied to the wafer 200 accommodated within the process chamber 201.

Specifically, the valves 243a and 243c are opened to allow a BTCSM gas and a pyridine gas to flow through the gas supply pipes 232a and 232c, respectively. The flow rates of the BTCSM gas and the pyridine gas are respectively adjusted by the MFCs 241a and 241c. The BTCSM gas and the pyridine gas are supplied into the process chamber 201 via the nozzles 249a and 249c, are subsequently post-mixed and are exhausted from the exhaust pipe 231. At this time, the valves 243d and 243f are opened to allow an $N_2$ gas to flow through the gas supply pipes 232d and 232f. The flow rates of the $N_2$ gas flowing through the gas supply pipes 232d and 232f are adjusted by the MFCs 241d and 241f, respectively. The $N_2$ gas is supplied into the process chamber 201 together with the BTCSM gas and the pyridine gas and is exhausted from the exhaust pipe 231. Furthermore, in order to prevent the BTCSM gas and the pyridine gas from entering the nozzle 249b, the valve 243e is opened to allow the $N_2$ gas to flow through the gas supply pipe 232e. The $N_2$ gas is supplied into the process chamber 201 via the gas supply pipe 232b and the nozzle 249b and is exhausted from the exhaust pipe 231.

At this time, the internal pressure of the process chamber 201 may be set to fall within a range of, for example, 1 to 3,000 Pa, specifically 133 to 2,666 Pa, by appropriately adjusting the APC valve 244. The supply flow rate of the BTCSM gas controlled by the MFC 241a may be set to fall within a range of, for example, 10 to 2,000 sccm, specifically 10 to 1,000 sccm. The supply flow rate of the pyridine gas controlled by the MFC 241c may be set to fall within a range of, for example, 1 to 2,000 sccm, specifically 10 to 1,000 sccm. The supply flow rates of the $N_2$ gas controlled by the MFCs 241d to 241f may be respectively set to fall within a range of, for example, 100 to 10,000 sccm. The time period, during which the BTCSM gas and the pyridine gas are supplied to the wafer 200, may be set to fall within a range of, for example, 1 to 100 seconds, specifically 5 to 60 seconds.

At this time, the temperature of the heater 207 is set such that the internal temperature of the process chamber 201, i.e., the temperature of the wafer 200, becomes a temperature (film-forming temperature) which falls within a range of, for example, 10 degrees C. or higher to 90 degrees C. or lower, specifically room temperature (25 degrees C.) or higher to 70 degrees C. or lower, more specifically 50 degrees C. or higher to 70 degrees C. or lower.

When the internal pressure of the process chamber 201 is set to a predetermined pressure (e.g., 1,333 Pa) within the aforementioned range, if the temperature of the wafer 200 at the film-forming step is less than 10 degrees C., there may be a case where the gases (at least one of the BTCSM gas, the $H_2O$ gas and the pyridine gas supplied at steps 1 and 2) supplied into the process chamber 201 are likely to agglutinate, which may be liquefied. As a result, the etching resistance (also referred to as HF resistance or acid resistance) of the film formed on the wafer 200 to hydrogen fluoride (HF) or the like may deteriorate, or the in-plane film thickness uniformity or in-plane film quality uniformity of this film may deteriorate. By setting the temperature of the wafer 200 at the film-forming step to become 10 degrees C. or higher, it is possible to solve this problem. By setting the temperature of the wafer 200 at the film-forming step to become room temperature or higher, it is easy to suppress the agglutination reaction of the gases supplied into the process chamber 201. As a result, it is possible to enhance the etching resistance of the film formed on the wafer 200, and to improve the in-plane film thickness uniformity or in-plane film quality uniformity of this film. By setting the temperature of the wafer 200 at the film-forming step to become 50 degrees C. or higher, it is possible to reliably suppress the agglutination reaction of the gases supplied into the process chamber 201, to further enhance the etching resistance of the film formed on the wafer 200, and to improve the in-plane film thickness uniformity or in-plane film quality uniformity of this film.

Furthermore, when the internal pressure of the process chamber 201 is set to a predetermined pressure (e.g., 1,333 Pa) within the aforementioned range, if the temperature of the wafer 200 at the film-forming step exceeds 90 degrees C., there may be a case where it becomes difficult for the film formation reaction on the wafer 200 (formation reaction of a first layer and a second layer at steps 1 and 2, which will be described later) to proceed and the thickness of a layer formed per cycle is reduced (a cycle rate is reduced). As a result, the film formation rate of the film formed on the wafer 200 may be reduced. By setting the temperature of the wafer 200 at the film-forming step at 90 degrees C. or lower, it is possible to solve this problem. By setting the temperature of the wafer 200 at the film-forming step at 70 degrees C. or lower, it is possible to reliably secure (maintain) a practical level of cycle rate, i.e., a practical level of film formation rate.

Accordingly, it is desirable to set the internal temperature of the process chamber 201 at the film-forming step, i.e., the temperature of the wafer 200 (film-forming temperature), to fall within a range of 10 degrees C. or higher to 90 degrees C. or lower, specifically room temperature or higher to 70 degrees C. or lower, more specifically 50 degrees or higher C to 70 degrees C. or lower.

By supplying the BTCSM gas to the wafer 200 under the aforementioned conditions, it may be possible to form an Si-containing layer containing C and Cl having a thickness of, for example, about less than one atomic layer to several atomic layers, as the first layer on the wafer 200 (a base film on the surface). The Si-containing layer containing C and Cl is a layer containing an Si—C bond. The Si-containing layer containing C and Cl may be an Si layer containing C and Cl, an adsorption layer of BTCSM, or may include both. In the present disclosure, the Si-containing layer containing C and Cl may also be referred to simply as an Si-containing layer containing C for the sake of convenience.

The Si layer containing C and Cl collectively refers to all layers including, in addition to a continuous layer formed of Si and containing C and Cl, a discontinuous layer and an Si thin film containing C and Cl formed by overlapping these layers. The continuous layer formed of Si and containing C and Cl may also be referred to as an Si thin film containing C and Cl. Si constituting the Si layer containing C and Cl includes, in addition to the one in which a bond with C or Cl is not completely broken, the one in which a bond with C or Cl is completely broken.

The adsorption layer of BTCSM includes, in addition to a continuous adsorption layer formed of BTBAS molecules, a discontinuous adsorption layer. That is, the adsorption layer of BTCSM includes one molecular layer formed of BTCSM molecules or an adsorption layer having a thickness of less than one molecular layer. The BTCSM molecules constituting the adsorption layer of BTCSM include a molecule in which a bond of Si and C is partially broken, or a molecule in which a bond of Si and Cl is partially broken. That is, the adsorption layer of BTCSM may be a physisorption layer of BTCSM, a chemisorption layer of BTCSM, or may include both.

In this regard, the layer having a thickness of less than one atomic layer refers to an atomic layer formed discontinuously, and the layer having a thickness of one atomic layer refers to an atomic layer formed continuously. The layer having a thickness of less than one molecular layer refers to a molecular layer formed discontinuously, and the layer having a thickness of one molecular layer refers to a molecular layer formed continuously. The Si-containing layer containing C and Cl may include both the Si layer containing C and Cl and the adsorption layer of BTCSM. However, as described above, the Si-containing layer containing C and Cl may be expressed as "one atomic layer", "several atomic layers" or the like.

If the thickness of the first layer formed on the wafer 200 exceeds several atomic layers, an oxidizing reaction at step 2 as described hereinbelow fails to reach the entire first layer. A minimum value of the thickness of the first layer which can be formed on the wafer 200 is less than one atomic layer. Accordingly, it is desirable that the thickness of the first layer be approximately from less than one atomic layer to several atomic layers. By setting the thickness of the first layer at one atomic layer or less, i.e., one atomic layer or less than one atomic layer, it is possible to relatively increase the oxidizing reaction at step 2 as described hereinbelow, and to shorten the time required for the oxidizing reaction at step 2. It is also possible to shorten the time required in forming the first layer at step 1. As a result, it is possible to shorten the processing time per one cycle and to shorten the total processing time. That is, it is also possible to increase the film formation rate. Furthermore, by setting the thickness of the first layer at one atomic layer or less, it is also possible to enhance the controllability of the film thickness uniformity.

The Si layer containing C and Cl is formed by depositing Si on the wafer 200 under a condition that the BTCSM gas is autolyzed (pyrolyzed). The adsorption layer of BTCSM is formed by adsorbing BTCSM on the wafer 200 under a condition that the BTCSM gas is not autolyzed (pyrolyzed). Under any condition, at least some of the Si—C bonds in the BTCSM gas are maintained without being broken and are directly introduced into the Si-containing layer containing C and Cl. It is more desirable to form the Si layer containing C and Cl on the wafer 200 than to form the adsorption layer of BTCSM on the wafer 200 so as to increase the film formation rate. However, in this embodiment, since the temperature of the wafer 200 is set at a low temperature of, for example, 90 degrees C. or lower, the adsorption layer of BTCSM, rather than the Si layer containing C and Cl, is likely to be formed on the wafer 200. When the pyridine gas is not supplied together with the BTCSM gas, the adsorption layer of BTCSM is likely to be configured with a physisorption layer of BTCSM, rather than the chemisorption layer of BTCSM.

The pyridine gas acts as a catalyst gas that weakens a bonding force of an O—H bond existing on the surface of the wafer 200, promotes decomposition of BTCSM, and promotes formation of the first layer by chemisorption of BTCSM molecules. That is, when the pyridine gas is supplied to the wafer 200, the pyridine gas acts on the O—H bond existing on the surface of the wafer 200 so as to weaken the bonding force thereof. H whose bonding force is weakened reacts with Cl of the BTCSM gas to generate a gaseous substance containing Cl and H. Therefore, H desorbs from the surface of the wafer 200 and Cl also desorbs from the BTCSM molecules. The BTCSM molecules (halide) losing Cl chemisorb on the surface of the wafer 200 or the like. Accordingly, a chemisorption layer of BTCSM is formed as the first layer on the wafer 200.

The bonding force of the O—H bond existing on the surface of the wafer 200 is weakened by the catalytic action of the pyridine gas because N having a lone pair of electrons in the pyridine molecules acts to attract H. The compounds with large pKa become stronger in the force attracting H. The decomposition of BTCSM may be promoted by using a compound having pKa of 5 or more as a catalyst gas, so that it is possible to promote the formation of the first layer by chemisorption. However, when a compound with excessively large pKa is used as the catalyst gas, there may be a case where Cl drawn out from the BTCSM molecules reacts with the catalyst gas to generate a salt (particle source) such as ammonium chloride ($NH_4Cl$) or the like. Therefore, it is desirable to use a compound having pKa of, for example, 11 or less, specifically 7 or less, as the catalyst gas. Since the pyridine gas has relatively large pKa of about 5.67 and is 7 or less, it may be appropriately used as the catalyst gas.

After the first layer is formed, the valves 243a and 243c are closed to stop the supply of the BTCSM gas and the pyridine gas into the process chamber 201, respectively. At this time, the interior of the process chamber 201 is vacuum-exhausted by the vacuum pump 246 while opening the AP valve 244. Thus, the BTCSM gas and pyridine gas unreacted or contributed to the formation of the first layer, the reaction byproduct and the like, which remain within the process chamber 201, are removed from the interior of the process chamber 201. At this time, the supply of the $N_2$ gas into the process chamber 201 is maintained while opening the valves 243d to 243f. The $N_2$ gas acts as a purge gas. This makes it possible to enhance the effect of removing the BTCSM gas and pyridine gas unreacted or contributed to the formation of the first layer, which remain within the process chamber 201, from the interior of the process chamber 201.

At this time, the gas remaining within the process chamber 201 may not be completely removed and the interior of the process chamber 201 may not be completely purged. If the amount of the gas remaining within the process chamber 201 is small, there is no possibility that an adverse effect is generated at step 2 which will be performed later. In this case, it is not necessary to make the flow rate of the $N_2$ gas supplied into the process chamber 201 become large. For example, by supplying the $N_2$ gas substantially in the same amount as the volume of the reaction tube 203 (the process chamber 201), it is possible to perform a purge operation such that an adverse effect is not generated at step 2. By not completely purging the interior of the process chamber 201 in this way, it is possible to shorten the purge time and to improve the throughput. In addition, it is possible to suppress the consumption of the $N_2$ gas to a necessary minimum level.

As the precursor gas, it may be possible to use, other than the BTCSM gas, for example, a silane precursor gas having an Si—C bond such as a BTCSE gas, a TCDMDS gas, a DCTMDS gas, an MCPMDS gas or the like.

As the catalyst gas, it may be possible to use, other than the pyridine gas, for example, a cyclic amine-based gas such as an aminopyridine gas, a picoline gas, a lutidine gas, a piperazine gas, a piperidine gas or the like, a chain amine-based gas such as a TEA gas, a DEA gas, an MEA gas, a TMA gas, an MMA gas or the like, or a non-amine-based gas such as an $NH_3$ gas or the like.

As the inert gas, it may be possible to use, other than the $N_2$ gas, for example, a rare gas such as an Ar gas, an He gas, an Ne gas, a Xe gas or the like.

[Step 2]

At this step, an $H_2O$ gas and a pyridine gas are supplied to the wafer 200 accommodated within the process chamber 201.

Specifically, the opening/closing control of the valves 243b, 243c, and 243d to 243f is performed in the same procedure as the opening/closing control of the valves 243a, 243c, and 243d to 243f at step 1. The flow rates of the $H_2O$ gas and the pyridine gas are adjusted by the MFCs 241b and 241c, respectively. The $H_2O$ gas and the pyridine gas are supplied into the process chamber 201 via the nozzles 249b and 249c, and are subsequently mixed (post-mixed) and are exhausted from the exhaust pipe 231. An $N_2$ gas for preventing the $H_2O$ gas or the like from entering the nozzle 249a is supplied into the process chamber 201 via the gas supply pipe 232a and the nozzle 249a and is exhausted from the exhaust pipe 231.

At this time, the supply flow rate of the $H_2O$ gas controlled by the MFC 241b may be set to fall within a range of, for example, 10 to 10,000 sccm, specifically 100 to 1,000 sccm. The supply flow rate of the pyridine gas controlled by the MFC 241c may be set to fall within a range of, for example, 1 to 2,000 sccm, specifically 10 to 1,000 sccm. The time period, during which the $H_2O$ gas and the pyridine gas are supplied to the wafer 200, may to fall within a range of, for example, 1 to 100 seconds, specifically 5 to 60 seconds. Other processing conditions may be similar to, for example, the processing conditions of step 1.

By supplying the $H_2O$ gas to the wafer 200 under the aforementioned conditions, at least a portion of the first layer formed on the wafer 200 at step 1 is oxidized (modified). As the first layer is modified, a second layer containing Si, O and C, i.e., a silicon oxycarbide layer (SiOC layer), may be formed. When forming the second layer, at least some of the Si—C bonds contained in the first layer are maintained without being broken and are introduced into (remain on) the second layer as is. When forming the second layer, an impurity such as Cl or the like contained in the first layer, which constitutes a gaseous substance containing at least Cl in the process of the modifying reaction with the $H_2O$ gas, is discharged from the interior of the process chamber 201. That is, an impurity such as Cl in the first layer is drawn out or desorbed from the first layer so as to be separated from the first layer. Thus, the second layer becomes a layer having less impurity of Cl and the like than the first layer.

The pyridine gas acts as a catalyst gas that weakens a bonding force of an O—H bond possessed by the $H_2O$ gas, promotes decomposition of the $H_2O$ gas, and promotes formation of the second layer by the reaction of the first layer and the $H_2O$ gas. That is, when the pyridine gas is supplied to the wafer 200, the pyridine gas acts on the O—H bond possessed by the $H_2O$ gas so as to weaken the bonding force thereof. H whose bonding force is weakened reacts with Cl of the first layer formed on the wafer 200 to generate a gaseous substance containing Cl and H. Therefore, H desorbs from the $H_2O$ molecules and Cl also desorbs from the first layer. 0 of the $H_2O$ gas, which loses H, bonds with Si of the first layer in which Cl is desorbed, and at least some of C atoms remain. Accordingly, the oxidized first layer, i.e., the second layer, is formed on the wafer 200.

The bonding force of the O—H bond possessed by the $H_2O$ gas is weakened by the catalytic action of the pyridine gas because N having a lone pair of electrons in the pyridine molecules acts to attract H. As described above, the compounds with large pKa become stronger in the force attracting H. The bonding force of the O—H bond possessed by the $H_2O$ gas may be properly weakened by using a compound having pKa of 5 or more as a catalyst gas, so that it is possible to promote the aforementioned oxidizing reaction. However, when a compound with excessively large pKa is used as the catalyst gas, there may be a case where Cl drawn out from the first layer reacts with the catalyst gas to generate a salt (particle source) such as $NH_4Cl$ or the like. Therefore, it is desirable to use a compound having pKa of, for example, 11 or less, specifically 7 or less, as the catalyst gas. Since the pyridine gas has relatively large pKa of about 5.67 and is 7 or less, it may be appropriately used as the catalyst gas. This is similar to that of step 1.

After the second layer is formed, the valves 243b and 243c are closed to stop the supply of each of the $H_2O$ gas and the pyridine gas into the process chamber 201. Then, the $H_2O$ gas and pyridine gas unreacted or contributed to the formation of the second layer, the reaction byproduct and the like, which remain within the process chamber 201, are removed from the interior of the process chamber 201 according to the same processing procedures as those of step 1. At this time, similar to step 1, the gas or the like remaining within the process chamber 201 may not be completely removed.

As the reaction gas, it may be possible to use, other than the $H_2O$ gas, for example, an O-containing gas containing an O—H bond such as a hydrogen peroxide ($H_2O_2$) gas or the like. As the reaction gas, it may also be possible to use an O-containing gas not containing an O—H bond, for example, an oxygen ($O_2$) gas, an ozone ($O_3$) gas, a hydrogen ($H_2$) gas+$O_2$ gas, an $H_2$ gas+$O_3$ gas or the like.

As the catalyst gas, it may be possible to use, other than the pyridine gas, for example, various kinds of amine-based gases or non-amine-based gases described above. That is, as the catalyst gas used at step 2, it may be possible to use a gas having the same molecular structure (chemical structure) as that of the catalyst gas used at step 1, i.e., a gas having the same material. As the catalyst gas used at step 2, it may also be possible to use a gas having a molecular structure different from that of the catalyst gas used at step 1, i.e., a gas having a different material.

As the inert gas, it may be possible to use, other than the $N_2$ gas, for example, various kinds of rare gases mentioned above.

[Performing a Predetermined Number of Times]

An SiOC film having a predetermined composition and a predetermined thickness can be formed on the wafer 200 by performing a cycle once or more (a predetermined number of times), the cycle including non-simultaneously, i.e., non-synchronously, and alternately performing steps 1 and 2 described above. The aforementioned cycle may be repeated multiple times. That is, the thickness of the second layer (SiOC layer) formed per one cycle may be set smaller than a desired thickness and the aforementioned cycle may be repeated multiple times until the thickness of the SiOC film formed by laminating the SiOC layer becomes equal to the desired thickness.

(Modification Step)

After the SiOC film is formed on the wafer 200, it is heated by the heater 207 such that the temperature of the wafer 200 becomes a desired temperature. When the temperature of the wafer 200 becomes the desired temperature, an $NF_3$ gas is supplied to the wafer 200 in the process chamber 201.

At this step, the opening/closing control of the valves 243a, and 243d to 243f is performed in the same procedure as the opening/closing control of the valves 243a, and 243d to 243f at step 1 of the film-forming step described above. The flow rate of the $NF_3$ gas is adjusted by the MFC 241a.

The $NF_3$ gas is supplied into the process chamber 201 via the nozzle 249a and is exhausted from the exhaust pipe 231. At this time, the $NF_3$ gas is supplied to the SiOC film formed on the wafer 200.

At this time, the internal pressure of the process chamber 201 may be set to a pressure (modifying pressure) which falls within a range of, for example, 50 to 300 Torr (6,650 to 39,900 Pa), specifically 50 to 100 Torr (6,650 to 13,300 Pa), by appropriately adjusting the APC valve 244.

If the internal pressure of process chamber 201 is less than 50 Torr, there may be a case where it becomes difficult for the SiOC film formed on the wafer 200 and the $NF_3$ gas to react with each other to dope F into the SiOC film. By setting the internal pressure of the process chamber 201 to 50 Torr or more, it is possible to make the SiOC film react with the $NF_3$ gas to dope F into the SiOC film.

If the internal pressure of the process chamber 201 exceeds 300 Torr, there may be a case where the SiOC film formed on the wafer 200 is etched by the $NF_3$ gas and thus it is difficult to dope F into the SiOC film. By setting the internal pressure of the process chamber 201 to 300 Torr or less, it is possible to suppress the etching of the SiOC film and to dope F into the SiOC film without desorbing Si or C from the SiOC film. By setting the internal pressure of the process chamber 201 to 100 Torr or less, it is possible to reliably suppress the etching of the SiOC film and to more heavily dope F into the SiOC film.

In addition, at this time, the temperature of the heater 207 is set such that the temperature of the wafer 200 becomes a temperature (modifying temperature) which falls within a range of, for example, 300 degrees C. or higher to 500 degrees C. or lower, specifically 350 degrees C. or higher to 400 degrees C. or lower.

If the temperature of the wafer 200 is lower than 300 degrees C., there may be a case where it becomes difficult for the SiOC film formed on the wafer 200 and the $NF_3$ gas to react with each other to dope F into the SiOC film. By setting the temperature of the wafer 200 to become 300 degrees C. or higher, it is possible to make the SiOC film react with the $NF_3$ gas to dope F into the SiOC film. By setting the temperature of the wafer 200 to become 350 degrees C. or higher, it is possible to promote the reaction between the SiOC film and the $NF_3$ gas to more heavily dope F into the SiOC film.

If the temperature of the wafer 200 exceeds 500 degrees C., there may be a case where the SiOC film formed on the wafer 200 is etched by the $NF_3$ gas and it becomes difficult to dope F into the SiOC film. By setting the temperature of the wafer 200 to 500 degrees C. or lower, it is possible to suppress the etching of the SiOC film by the $NF_3$ gas, and to dope F into the SiOC film without desorbing Si or C from the SiOC film. By setting the temperature of the wafer 200 to 400 degrees C. or lower, it is possible to reliably suppress the etching of the SiOC film by the $NF_3$ gas and to more heavily dope F into the SiOC film.

Furthermore, the supply flow rate of the $NF_3$ gas controlled by the MFC 241a may be set to fall within a range of, for example, 1 to 2,000 sccm, specifically 10 to 1,000 sccm. The time period, during which the $NF_3$ gas is supplied to the wafer 200, may be set to fall within a range of, for example, 10 to 1,200 seconds, specifically 5 to 600 seconds. Other processing conditions may be similar to the processing conditions of step 1 at the film-forming step described above.

By supplying the $NF_3$ gas to the wafer 200 under the aforementioned conditions, it is possible to dope F into the SiOC film formed on the wafer 200. Thus, the SiOC film may be modified (fluorinated) into a film containing Si, O, C and F, i.e., an SiOCF film. The doping of F in this embodiment is performed widely (deeply) not only near the surface of the SiOC film but also over the entire region of the film including a region deeper than the surface. The SiOCF film may also be referred to as an F-doped SiOC film.

As the inert gas, it may be possible to use, other than the $N_2$ gas, for example, various kinds of rare gases mentioned above.

After the formation of the SiOCF film is completed, the valve 243a is closed to stop the supply of the $NF_3$ gas into the process chamber 201. Then, the $NF_3$ gas, the reaction byproduct or the like, which remains within the process chamber 201, are removed from the interior of the process chamber 201 according to the same processing procedures as those of step 1 at the film-forming step. At this time, similar to step 1, the gas or the like remaining within the process chamber 201 may not be completely removed.

(After Purge Step/Atmospheric Pressure Return Step)

After the modification step is completed, the $N_2$ gas is supplied from each of the gas supply pipes 232d to 232f into the process chamber 201 and is exhausted from the exhaust pipe 231. The $N_2$ gas acts as a purge gas. Thus, the interior of the process chamber 201 is purged, and the gas or the reaction byproduct, which remains within the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to an atmospheric pressure (atmospheric pressure return).

(Unloading Step)

Thereafter, the seal cap 219 is moved down by the boat elevator 115 to open the lower end of the manifold 209. The processed wafers 200 supported on the boat 217 are unloaded from the lower end of the manifold 209 outside of the reaction tube 203 (boat unloading). After the boat unloading, the shutter 219s is moved so that the lower end opening of the manifold 209 is sealed by the shutter 219s through the O-ring 220c (shutter closing). The processed wafers 200 are unloaded outside of the reaction tube 203 and are subsequently discharged from the boat 217 (wafer discharging).

(3) Effects According to the Present Embodiment

According to the present embodiment, one or more effects as set forth below may be achieved.

(a) By performing the modification step of supplying the $NF_3$ gas to the wafer 200 under the condition in which etching of the SiOC film does not occur after forming the SiOC film at the film-forming step, it becomes possible to dope F into the SiOC film. This makes it possible to modify this film into an SiOCF film having a higher etching resistance than that of the F-free SiOC film. Moreover, by doping F into the SiOC film, it becomes possible to modify this film into a low-k film having a lower dielectric constant than the F-free SiOC film which is a low-k film.

(b) By performing the modification step of heating the wafer 200 to a modifying temperature (a temperature within a range of 300 degrees C. or higher to 500 degrees C. or lower, specifically 350 degrees C. or higher to 400 degrees C. or lower) higher than the film-forming temperature after forming the SiOC film at the film-forming step, it becomes possible to desorb impurities such as moisture ($H_2O$) or $C_xH_y$ contained in the film during the film-forming process, from the film, thereby modifying the SiOC film, so that this makes it possible to improve the quality of the SiOCF film formed. That is, by performing the modification step, it becomes possible to perform an annealing process on the SiOC film simultaneously with doping of F into the SiOC film. This makes it possible to further improve the etching resistance of the SiOCF film formed by modifying the SiOC film. In addition, it becomes possible to further reduce the dielectric constant of this film by using this film as a porous film.

(c) Since the supply of the BTCSM gas and the pyridine gas to the wafer 200 and the supply of the $H_2O$ gas and the pyridine gas to the wafer 200 are non-synchronously and alternately performed at the film-forming step, it becomes possible to improve the step coverage of the SiOC film, i.e., the SiOCF film formed by modifying this film, the film thickness uniformity, the film thickness controllability, and the like.

Utilizing the aforementioned characteristics, the film-forming method of this embodiment is particularly effective when performing embedding of a recess such as a trench (groove) or a hole formed on the surface of the wafer 200. For example, a spin on glass (SOG) method using a coating material or a plasma CVD method is known as the method for forming the SiOCF film. However, in the SOG method, it may be difficult to form a film with good coverage in a step portion such as a trench. In addition, similar to the SOG method, in the plasma CVD method, not only the step coverage may deteriorate, but also the surface of the wafer 200 may be damaged by plasma.

According to the film-forming method of this embodiment, since the precursor gas and the reaction gas are alternately supplied, a higher step coverage than the SOG method or the plasma CVD method can be obtained. Furthermore, according to the film-forming method of this embodiment, since the film-forming step and the modification step are performed under a non-plasma atmosphere, it is possible to avoid the wafer 200 from plasma damage.

(d) As described above, since the SiOCF film formed according to this embodiment has good suitability in terms of the etching resistance, step coverage, film thickness uniformity, and film thickness controllability, it is particularly effective when performing fine shape control required in the process of manufacturing a semiconductor device. For example, the SiOCF film formed according to this embodiment may be suitably applied to applications such as a sidewall spacer, an etching stopper, a hard mask and the like, and may also be applied to a patterning process that requires etching selectivity with films of other types, such as self-aligned double patterning (SADP), self-aligned quadruple patterning (SAQP) and the like.

Moreover, since the SiOCF film formed according to this embodiment is a low-k film having a dielectric constant lower than that of the F-free SiOC film, it is particularly effective when reducing the parasitic capacitance of a semiconductor device. For example, the SiOCF film formed according to this embodiment may be suitably applied to applications such as a buried insulating film and the like.

(e) The aforementioned effects can be similarly achieved even in the case where a halosilane precursor gas other than the BTCSM gas is used as the precursor gas, in the case where an oxidizing gas other than the $H_2O$ gas is used as the reaction gas, or in the case where an amine-based gas other than the pyridine gas is used as the catalyst gas. In addition, the aforementioned effects can be similarly achieved even in the case where a fluorine-based gas other than the $NF_3$ gas is used as the modifying gas.

Second Embodiment

As in the film-forming sequence illustrated in FIG. 5A or described below, an $F_2$ gas may be supplied to the wafer 200 to modify the surface of the SiOC film into a layer containing C and F and not containing Si and O, i.e., a fluorocarbon layer (CF layer), under a condition in which etching of the SiOC film does not occur after forming the SiOC film on the wafer 200.

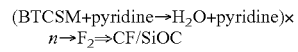

Hereinafter, some differences from the film-forming sequence according to the first embodiment will be described in detail.

When the wafer 200 is loaded into the process chamber 201, an SiOC film is formed on the wafer 200 under the same processing procedures and processing conditions as those of the film-forming step of the first embodiment. Thereafter, the modification step is performed by the same processing procedure as that of the modification step of the first embodiment. At the modification step, the $F_2$ gas is used as the C-free fluorine-based gas as described above. The flow rate of the $F_2$ gas is adjusted by the MFC 241a. The $F_2$ gas is supplied into the process chamber 201 via the nozzle 249a and is exhausted from the exhaust pipe 231. At this time, the $F_2$ gas is supplied to the SiOC film formed on the wafer 200.

At this time, the internal pressure of the process chamber 201 may be set at a pressure (modifying pressure) which falls within a range of, for example, 0.1 to 10 Torr (13.3 to 1,330 Pa), specifically 0.5 to 1 Torr (66.5 to 133 Pa), by appropriately adjusting the APC valve 244.

If the internal pressure of the process chamber 201 is less than 0.1 Torr, there may be a case where it becomes difficult for the SiOC film formed on the wafer 200 and the $F_2$ gas to react with each other, which makes it difficult to form C—F bonds on the surface of the SiOC film or desorb Si and O from the surface of the SiOC film. By setting the internal pressure of the process chamber 201 to 0.1 Torr or more, the SiOC film and the $F_2$ gas can react with each other to thereby proceed to form C—F bonds on the surface of the SiOC film or desorb Si or O from the surface of the SiOC film. This makes it possible to modify the surface of the SiOC film into a CF layer. By setting the internal pressure of the process chamber 201 to 0.5 Torr or more, the SiOC film and the $F_2$ gas can be reliably reacted with each other to thereby reliably modify the surface of the SiOC film into the CF layer.

If the internal pressure of the process chamber 201 exceeds 10 Torr, there may be a case where the SiOC film formed on the wafer 200 is etched by the $F_2$ gas making it difficult to modify the surface of the SiOC film into the CF layer. By setting the internal pressure of the process chamber 201 to 10 Torr or less, it is possible to modify the surface of the SiOC film into the CF layer while suppressing the etching of the SiOC film. By setting the internal pressure of the process chamber 201 to 1 Torr or less, it is possible to reliably modify the surface of the SiOC film into the CF layer while reliably suppressing the etching of the SiOC film.

Furthermore, the temperature of the heater 207 is set such that the temperature of the wafer 200 becomes a temperature (modifying temperature) which falls within in a range of, for example, room temperature or higher to 100 degrees C. or lower, specifically room temperature or higher to 50 degrees C. or lower.

If the temperature of the wafer 200 is lower than room temperature, there may be a case where it becomes difficult for the SiOC film formed on the wafer 200 and the $F_2$ gas to react with each other, which makes it difficult to form C—F bonds on the surface of the SiOC film or desorb Si or O from the surface of the SiOC film. By setting the temperature of the wafer 200 to become room temperature or higher, it is possible to make the SiOC film react with the $F_2$ gas to form C—F bonds on the surface of the SiOC film and desorb Si or O from the surface of the SiOC film. Thus, it is possible to modify the surface of the SiOC film into the CF layer.

If the temperature of the wafer 200 exceeds 100 degrees C., there may be a case where the SiOC film formed on the wafer 200 is etched by the $F_2$ gas, which makes it difficult to modify the surface of the SiOC film into the CF layer. By setting the temperature of the wafer 200 to 100 degrees C. or lower, it is possible to modify the surface of the SiOC film into the CF layer while suppressing the etching of the SiOC film. By setting the temperature of the wafer 200 to 50 degrees C. or lower, it is possible to reliably modify the surface of the SiOC film into the CF layer while reliably suppressing the etching of the SiOC film. That is, it is possible to suppress the etching of the SiOC film and to form the CF layer on the surface of the SiOC film in a well-balanced manner.

Furthermore, the supply flow rate of the $F_2$ gas controlled by the MFC 241a may be set to fall within in a range of, for example, 1 to 2,000 sccm, specifically 10 to 1,000 sccm. The time period, during which the $F_2$ gas supplied to the wafer 200, may be set to fall within a range of, for example, 10 to 1,200 seconds, specifically 30 to 600 seconds. Other conditions may be similar to the processing conditions of step 1 at the film-forming step of the first embodiment.

By supplying the $F_2$ gas to the wafer 200 under the aforementioned conditions, it is possible to dope F on the surface of the SiOC film formed on the wafer 200 to form C—F bonds. It is also possible to desorb Si and O from the surface of this film while leaving C on the surface of the SiOC film. Thus, the surface of the SiOC film may be modified into a layer containing C and F and not containing Si and O, i.e., the CF layer. Furthermore, when the CF layer is formed, Si constitutes the byproduct such as $SiF_4$ or the like and is discharged from the interior of the process chamber 201.

The CF layer is formed by adding (doping) F into the surface of the SiOC film. However, after the CF layer is formed, since the CF layer acts to suppress F from being added, no further F is added into the SiOC film. That is, the doping of F in this embodiment mainly proceeds near the surface of the SiOC film and tends to be difficult to proceed in a region deeper than the surface. Also, desorption of Si or O from the interior of the SiOC film mainly proceeds near the surface of the SiOC film and tends to be difficult to proceed in a region deeper than the surface. That is, according to this embodiment, it is possible to maintain the composition and film quality without modifying the region except for the surface of the SiOC film. Furthermore, as will be described hereinbelow, the CF layer formed from the modification of the surface of the SiOC also serves to suppress the addition of oxygen (O) or the like into the SiOC film when the wafer 200 is exposed to the atmosphere. From these facts, the CF layer may also be referred to as a diffusion suppressing layer (block layer), a barrier layer, a cap layer, or the like against F or O.

As the fluorine-based gas, it may be possible to use, other than the $F_2$ gas, a gas obtained by mixing an iodine fluoride ($IF_7$) gas, a chlorine fluoride ($ClF_3$) gas, an HF gas, or a gas obtained by mixing these gases in any combination thereof.

After the modification of the surface of the SiOC film is completed, the valve 243a is closed to stop the supply of the $F_2$ gas into the process chamber 201. Then, the $F_2$ gas, the reaction byproduct or the like, which remains within the process chamber 201, is removed from the interior of the process chamber 201 according to the same processing procedure as that of step 1 of the film-forming step. At this time, similar to step 1, the gas or the like remaining within the process chamber 201 may not be completely removed.

Thereafter, the after purge step, the atmospheric pressure return step, and the unloading step are performed under the same processing procedures and processing conditions as those of the first embodiment, and the processed wafers 200 are discharged from the boat 217, so that the substrate processing process according to this embodiment is completed.

According to this embodiment, by performing the modification step of supplying the $F_2$ gas to the wafer 200 under a condition in which the etching of the SiOC film does not occur after forming the SiOC film at the film-forming step, it is possible to modify the surface of the SiOC film into the CF layer. The CF layer functions as a protective film against liquid chemical (etchant) such as an HF solution. Therefore, by modifying the surface of the SiOC film into the CF layer, it is possible to form this film as a film having a higher etching resistance and a lower dielectric constant than the F-free SiOC film having no CF layer on the surface.

In addition, when the wafer 200 is heated at a modifying temperature higher than the film-forming temperature at the modification step after forming the SiOC film at the film-forming step, an impurity can be desorbed from the film. Thus, it is possible to improve the quality of the SiOC film whose surface is modified into the CF layer.

Furthermore, at the film-forming step, since the supply of the BTCSM gas and the pyridine gas to the wafer 200 and the supply of the $H_2O$ gas and the pyridine gas to the wafer 200 are non-synchronously and alternately performed, it is possible to improve the step coverage of the SiOC film whose surface is modified into the CF layer, the film thickness uniformity, and the film thickness controllability.

In addition, the CF layer formed on the surface of the SiOC film acts to suppress the addition of O or the like into the SiOC film when the wafer 200 is exposed to the atmosphere. This makes it possible to form a film formed on the wafer 200 as a stable film having strong resistant to exposure to the atmosphere.

The aforementioned effects can be similarly achieved even in the case where a halosilane precursor gas other than the BTCSM gas is used as the precursor gas, in the case where an oxidizing gas other than the $H_2O$ gas is used as the reaction gas, or in the case where an amine-based gas other than the pyridine gas is used as the catalyst gas. In addition, the aforementioned effects can be similarly achieved even in the case where a fluorine-based gas other than the $F_2$ gas is used as the modifying gas.

Other Embodiments of the Present Disclosure

While the embodiments of the present disclosure have been specifically described above, the present disclosure is not limited to the aforementioned embodiments but may be differently modified without departing from the spirit of the present disclosure.

(a) In the aforementioned embodiments, there has been described an example in which the film-forming step and the modification step are sequentially performed once. The present disclosure is not limited to the aforementioned embodiments but the film-forming step and the modification step may be alternately repeated multiple times.

For example, as in the film-forming sequence illustrated in FIG. 4B or described below, a cycle may be performed a plurality of times ($n_2$ times), the cycle alternately performing: a layer forming step in which a set non-simultaneously performing a step of supplying a BTCSM gas and a pyridine gas to a wafer and a step of supplying an H$_2$O gas and a pyridine gas to the wafer, is performed a predetermined number of times ($n_1$ times) to form an SiOC layer on the wafer, and a modification step of supplying an NF$_3$ gas to the wafer to modify the SiOC layer into an SiOCF layer under a condition in which etching of the SiOC layer formed on the wafer does not occur, wherein $n_1$ and $n_2$ are each an integer of 1 or more. Even in this case, the SiOCF film may be formed on the wafer. FIG. 4B illustrates an example in which the number of times ($n_1$) of performing the set at the layer forming step is set to 2 times.

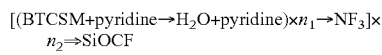

The processing procedures and processing conditions of the layer forming step and the modification step may be similar to those of the film-forming step and the modification step of the first embodiment. By setting the thickness of the SiOC layer formed per one layer forming step at such a thickness that the entire region of this layer can be uniformly modified at the modification step, it is possible to reliably dope F over the entire region in the thickness direction of the SiOCF film, and to uniformize the F concentration in the film thickness direction.

Furthermore, for example, as in the film-forming sequence illustrated in FIG. 5A or described below, there may be performed a cycle a plurality of times ($n_2$ times), the cycle alternately performing: a layer forming step in which a set non-simultaneously performing a step of supplying a BTCSM gas and a pyridine gas to a wafer and a step of supplying an H$_2$O gas and a pyridine gas to the wafer, is performed a predetermined number of times ($n_1$ times) to form an SiOC layer on the wafer, and a modification step of suppling an F$_2$ gas to the wafer to modify the surface of the SiOC layer into a CF layer under a condition in which etching of the SiOC layer formed on the wafer does not occur, wherein $n_1$ and $n_2$ are each an integer of 1 or more. In this case, a laminated film can be formed by alternately laminating the SiOC layer and the CF layer a plurality of times on the wafer. FIG. 5B illustrates an example in which the number of times ($n_1$) of performing the set at the layer forming step is set to 2 times.

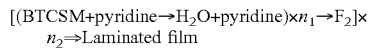

The processing procedures and processing conditions of the layer forming step and the modification step may be similar to those of the film-forming step and the modification step of the second embodiment. By setting the thickness of the SiOC layer formed per one layer forming step at 5 nm or less, specifically 1 nm or less, it is possible to form a laminated film to be finally formed as a film having characteristics unified in a stacking direction, i.e., a nanolaminate film having characteristics which are integrally inseparable as a whole.

Figure 6:
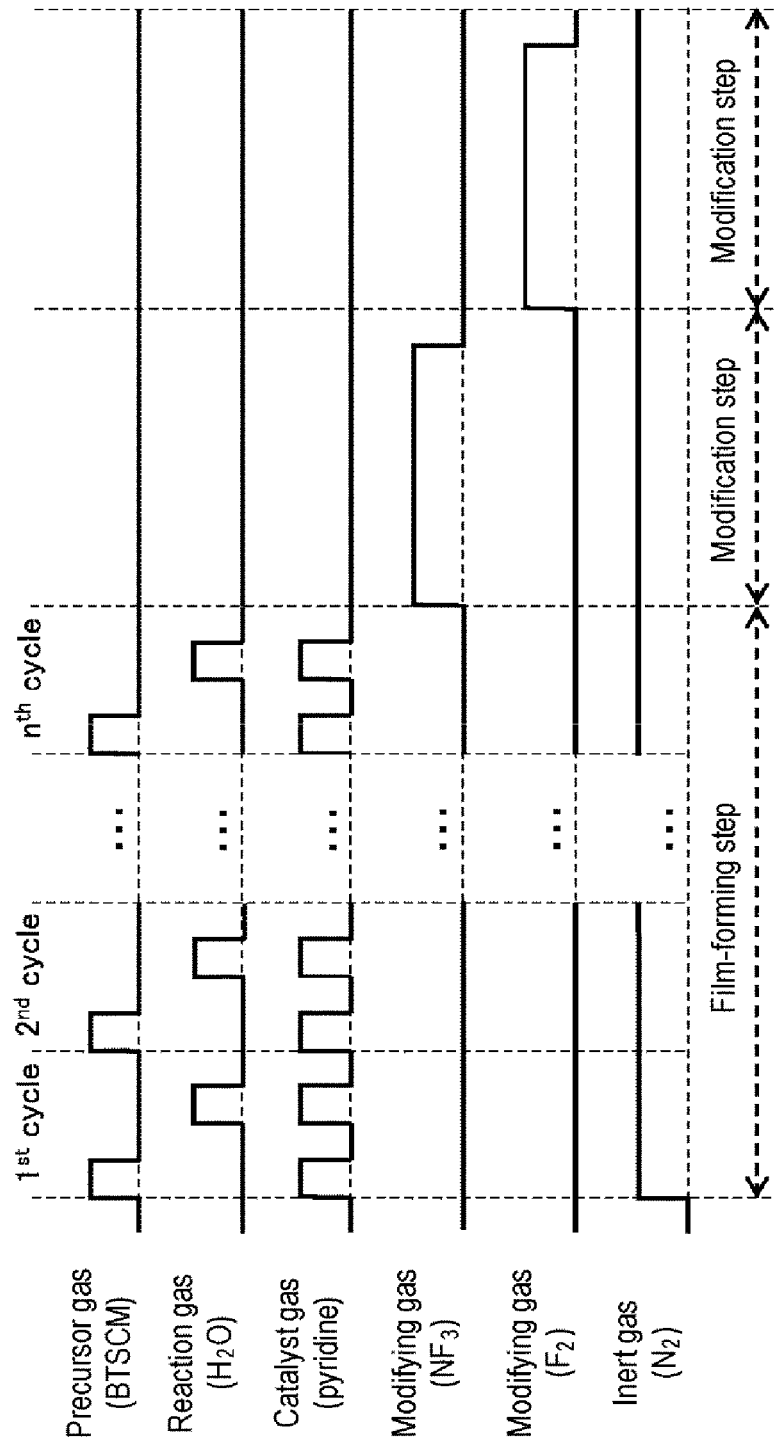
FIG. 6 is a diagram illustrating a film-forming sequence according to another embodiment of the present disclosure.

(b) As in the film-forming sequence illustrated in FIG. 6 or described below, there may be sequentially performed: a film-forming step of forming an SiOC film on a wafer, a first modification step of suppling an NF$_3$ gas to the wafer to modify the SiOC film into an SiOCF film under a condition in which etching of the SiOC film formed on the wafer does not occur, and a second modification step of supplying an F$_2$ gas to the wafer to modify the surface of the SiOCF film into a CF layer under a condition in which etching of the SiOCF film formed on the wafer does not occur. In this case, it is possible to form the SiOCF film whose surface is modified into the CF layer on the wafer.

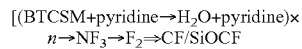

The processing procedures and processing conditions of the film-forming step and the first modification step may be similar to those of the film-forming step and the modification step of the first embodiment. The processing procedures and processing conditions of the second modification step may be similar to the processing procedures and processing conditions of the modification step of the second embodiment. In this case, the effects mentioned in the first and second embodiments may be simultaneously achieved.

(c) In the aforementioned embodiments, there has been described an example in which the film-forming step and the modification step are performed in-situ, i.e., in the same process chamber. The present disclosure is not limited to the aforementioned embodiments but the film-forming step and the modification step may be performed ex-situ, i.e., in different process chambers. If both steps are performed in-situ, the wafer may be processed consistently while the wafer is kept under vacuum without exposing the wafer to the atmosphere. Thus, it is possible to perform a stable film-forming process. If both steps are performed ex-situ, the internal temperature of each process chamber may be set in advance to, for example, the processing temperature at each step or a temperature close thereto. Thus, it is possible to shorten the time required for temperature adjustment and to enhance the production efficiency.

(d) At the film-forming step of the aforementioned embodiments, there has been described an example in which the reaction gas and the catalyst gas are supplied after supplying the precursor gas and the catalyst gas. The present disclosure is not limited to the aforementioned embodiments but the order of supplying these gases may be reversed. That is, the precursor gas and the catalyst gas may be supplied after supplying the reaction gas and the catalyst gas. By changing the supply order, it becomes possible to change the quality and the composition ratio of a film to be formed.

(e) In the embodiments or the like described above, there has been described an example in which a thermally activated reaction gas is used together with the catalyst gas when modifying the first layer into the second layer, i.e., an example in which the catalyst gas and the reaction gas are supplied under a non-plasma atmosphere. The present disclosure is not limited to the aforementioned embodiments but a plasma-excited reaction gas may be supplied. That is, the reaction gas may be supplied under a plasma atmosphere. The processing conditions at this time may be similar to, for example, the processing conditions of the aforementioned embodiments.

(f) In the embodiments or the like described above, there has been described an example in which a chlorosilane precursor gas is used as the precursor gas. The present disclosure is not limited to these embodiments but a halosilane precursor gas other than the chlorosilane precursor gas, for example, a fluorosilane precursor gas, a bromosilane precursor gas, or the like may be used. The processing conditions at this time may be similar to, for example, the processing conditions of the aforementioned embodiments.

(g) As in the film-forming sequence described below, at the film-forming step, there may be performed a cycle a predetermined number of times (once or more), the cycle non-simultaneously performing: a step of supplying a C-free precursor gas such as an HCDS gas to a wafer, a step of supplying a reaction gas such as a TEA gas (a gas containing N and C) to the wafer, and a step of supplying a reaction gas such as an O₂ gas (O-containing gas) to the wafer, to form an SiOC film or an SiOCN film (hereinafter, both are also referred to as an SiOC(N) film) on the wafer. At step of supplying the O₂ gas, the SiOC film is formed by oxidizing the SiCN layer until N is sufficiently desorbed from the SiCN layer thus formed, and at step of supplying the O₂ gas, the SiOCN film is formed by stopping oxidation of the SiCN layer before N is sufficiently desorbed from the SiCN layer thus formed. Even for the film formed by this procedure, the same effects as those of the aforementioned embodiments may be achieved by performing the modification step as in the aforementioned embodiments.

(HCDS→TEA→O₂)×n→NF₃⇒SiOC(N)F (HCDS→TEA→O₂)×n→F₂⇒CF/SiOC(N)

[(HCDS→TEA→O₂)×n₁→NF₃]×n₂⇒SiOC(N)F

[(HCDS→TEA→O₂)×n₁→F₂]×n₂⇒Laminated film (HCDS→TEA→O₂)×n→NF₃→F₂⇒CF/SiOC(N)F

The processing conditions at the time of supplying the HCDS gas may be set as follows, for example:

Wafer temperature: 250 to 700 degrees C., specifically 300 to 650 degrees C., more specifically 350 to 600 degrees C.

Internal pressure of process chamber: 1 to 2,666 Pa, specifically 67 to 1,333 Pa HCDS gas supply flow rate: 1 to 2,000 sccm, specifically 10 to 1,000 sccm N₂ gas supply flow rate: 100 to 10,000 sccm Gas supply time period: 1 to 120 seconds, specifically 1 to 60 seconds.

The processing conditions at the time of supplying the TEA gas may be set as follows, for example:

Internal pressure of process chamber: 1 to 5,000 Pa, specifically 1 to 4,000 Pa

TEA gas supply flow rate: 100 to 10,000 sccm

Gas supply time period: 1 to 200 seconds, specifically 1 to 120 seconds, more specifically 1 to 60 seconds Other processing conditions: The same as when supplying HCDS gas.

The processing conditions at the time of supplying the O₂ gas may be set as follows, for example:

Internal pressure of process chamber: 1 to 4,000 Pa, specifically 1 to 3,000 Pa

O₂ gas supply flow rate: 100 to 10,000 sccm

Gas supply time period: 1 to 120 seconds, specifically 1 to 60 seconds

Other processing conditions: The same as when supplying HCDS gas.

As the C-free precursor gas, it may be possible to use, other than the HCDS gas, an OCTS gas or the like.

As the gas containing N and C, it may be possible to use, other than the TEA gas, an amine-based gas such as a DEA gas, an MEA gas, a TMA gas, an MMA gas or the like, or an organic hydrazine-based gas such as a trimethylhydrazine ((CH₃)₂N₂(CH₃)H, abbreviation: TMH) gas, a dimethylhydrazine ((CH₃)₂N₂H₂, abbreviation: DMH) gas, a monomethylhydrazine ((CH₃)HN₂H₂, abbreviation: MMH) gas or the like. These gases may be supplied from, for example, the gas supply pipe 232b.

As the O-containing gas, it may be possible to use, other than the O₂ gas, an O₃ gas, an H₂O gas, an H₂O₂ gas, an H₂+O₂ gas, an H₂+O₃ gas or the like.

(h) As in the film-forming sequence example described below, at the film-forming step, a step of supplying an organic silane precursor such as a 1,4-disilabutane (Si₂C₂H₁₀, abbreviation: DSB) gas or the like and a catalytic material such as a trichloroborane (BCl₃) gas or the like into the process chamber accommodating the wafer and confining these gases in the process chamber, and a step of exhausting the interior of the process chamber may be performed a predetermined number of times (once or more) to form an SiC film on the wafer and then this SiC film is oxidized by a reaction gas (O-containing gas) such as the H₂O gas or the like so as to form an SiOC film on the wafer. Even for the film formed by this procedure, the same effects as those of the aforementioned embodiments may be achieved by performing the modification step as in the aforementioned embodiments.

(DSB+BCl₃)×n→H₂O→NF₃⇒SiOCF (DSB+BCl₃)×n→H₂O→F₂⇒CF/SiOC

[(DSB+BCl₃)×n₁→H₂O→NF₃]×n₂⇒SiOCF

[(DSB+BCl₃)×n₁→H₂O→F₂]×n₂⇒Laminated film (DSB+BCl₃)×n→H₂O→NF₃→F₂⇒CF/SiOCF

The processing conditions at this time may be set as follows, for example:

Wafer temperature: 200 to 400 degrees C., specifically 250 to 400 degrees C., more specifically 300 to 400 degrees C.

Internal pressure of process chamber: 100 to 5,000 Pa

DSB gas supply flow rate: 100 to 2,000 sccm

BCl₃ gas supply flow rate: 0.1 to 500 sccm

H₂O gas supply flow rate: 1 to 1,000 sccm

N₂ gas supply flow rate: 100 to 10,000 sccm

Confining time period: 0.5 to 30 minutes, specifically 0.5 to 20 minutes, more specifically 0.5 to 10 minutes.

As the organic silane precursor, it may be possible to use, other than the DSB gas, for example, SiC₂H₈, Si₂CH₈, SiC₃H₁₀, Si₃CH₁₀, SiC₄H₁₂, Si₂C₃H₁₂, Si₃C₂H₁₂, Si₄CH₁₂, SiC₂H₆, SiC₃H₈, Si₂C₂H₈, SiC₄H₁₀, Si₂C₃H₁₀, Si₃C₂H₁₀, or the like. These gases may be supplied from, for example, the gas supply pipe 232a.

As the catalytic material, it may be possible to use, other than the BCl₃ gas, BClH₂, BCl₂H, BOCl₃, BF₃, BBr₃, BI₃, B₂H₆, NF₃, or the like. These gases can be supplied from, for example, the gas supply pipe 232c.

As the O-containing gas, it may be possible to use, other than the H₂O gas, an O₂ gas, an O₃ gas, an H₂O₂ gas, an H₂+O₂ gas, an H₂+O₃ gas, or the like.

The SiOC film may also be formed by performing a step of supplying a DSB gas, a BCl₃ gas, and an H₂O gas into the process chamber accommodating the wafers and confining them in the process chamber, and a step of exhausting the interior of the process chamber a predetermined number of times. The processing conditions at this time may be similar to the processing conditions as described above.

(i) The present disclosure may be suitably applied to a case where an oxycarbide film containing a metal element such as titanium (Ti), zirconium (Zr), hafnium (Hf), tantalum (Ta), niobium (Nb), molybdenum (Mo), tungsten (W), yttrium (Y), strontium (Sr), lanthanum (La), aluminum (Al) or the like, i.e., a metal oxycarbide film, is formed on the wafer and F is doped into at least the surface of the film.

That is, the present disclosure may be suitably applied to a case where a TiOC film, a ZrOC film, an HfOC film, a TaOC film, an NbOC film, an MoOC film, a WOC film, a YOC film, an SrOC film, a LaOC film, or an AlOC film is formed on the wafer and F is doped into these films to modify these films into a TiOCF film, a ZrOCF film, an HfOCF film, a TaOCF film, an NbOCF film, an MoOCF film, a WOCF film, a YOCF film, an SrOCF film, an LaOCF film, and an AlOCF film. Furthermore, the present disclosure may be suitably applied to a case where a TiOC film, a ZrOC film, an HfOC film, a TaOC film, an NbOC film, an MoOC film, a WOC film, a YOC film, an SrOC film, an LaOC film, or an AlOC film is formed on the wafer and the surface of these films is modified into a CF layer.

For example, a TiOCF film or an HfOCF film may be formed on the wafer or a TiOC film or an HfOC film whose surface is modified into a CF layer may be formed using a metal compound containing a metal element such as a titaniumtetrachloride (TiCl$_4$) or a hafniumtetrachloride (HfCl$_4$) and Cl as the precursor by the film-forming sequences denoted below.

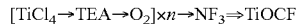

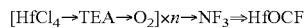

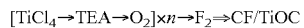

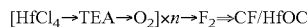

The processing procedures and processing conditions of the film-forming process at this time may be similar to those of the aforementioned embodiments. Even in these cases, effects similar to those of the aforementioned embodiments may be achieved. That is, the present disclosure may be suitably applied to a case where a semi-metal oxycarbide fluoride film or a metal oxycarbide fluoride film is formed, or a case where a semi-metal oxycarbide film or a metal oxycarbide film whose surface is modified into a CF layer is formed.

(j) Recipes (programs describing processing procedures and processing conditions) used in substrate processing may be prepared individually according to the processing contents (the film type, composition ratio, quality, film thickness, processing procedures and processing conditions of the film to be formed) and may be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for a single substrate processing apparatus to form films of different types, composition ratios, qualities and thicknesses with enhanced reproducibility. In addition, it is possible to reduce an operator's burden (e.g., a burden inputting processing procedures and processing conditions) and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

(k) In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed using a single-wafer-type substrate processing apparatus capable of processing a single substrate or several substrates at a time. In addition, in the aforementioned embodiments, there has been described an example in which films are formed using a substrate processing apparatus provided with a hot-wall-type processing furnace. The present disclosure is not limited to the aforementioned embodiments but may be appropriately applied to a case where films are formed using a substrate processing apparatus provided with a cold-wall-type processing furnace.

Figure 11:
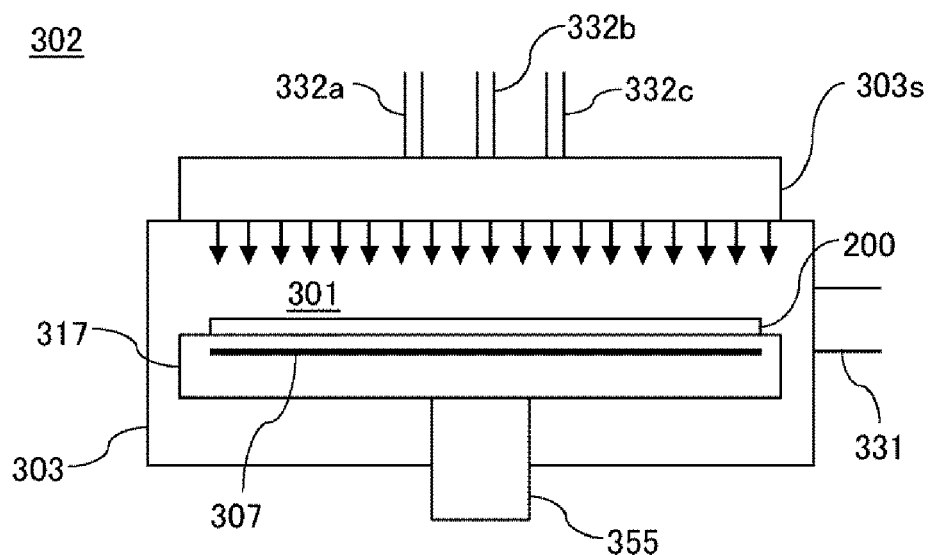
FIG. 11 is a schematic configuration diagram of a processing furnace of a substrate processing apparatus suitably used in another embodiment of the present disclosure, in which the portion of the processing furnace is shown in a vertical cross sectional view.

The present disclosure may be suitably applied to, e.g., a case where a film is formed using a substrate processing apparatus provided with a processing furnace 302 illustrated in FIG. 11. The processing furnace 302 includes a process vessel 303 which forms a process chamber 301, a shower head 303s configured to supply a gas into the process chamber 301 in a shower-like manner, a support table 317 configured to horizontally support one or more wafers 200, a rotary shaft 355 configured to support the support table 317 from below, and a heater 307 installed in the support table 317. Gas supply ports 332a to 332c are connected to inlets (gas introduction holes) of the shower head 303s. A gas supply system similar to the precursor gas supply system and the modifying gas supply system of the aforementioned embodiments is connected to the gas supply port 332a. A gas supply system similar to the reaction gas supply system of the aforementioned embodiments are connected to the gas supply port 332b. A gas supply system similar to the catalyst gas supply system of the aforementioned embodiments is connected to the gas supply port 332c. A gas distribution plate configured to supply a gas into the process chamber 301 in a shower-like manner is installed in outlets (gas discharge holes) of the shower head 303s. An exhaust port 331 configured to exhaust the interior of the process chamber 301 is installed in the process vessel 303. An exhaust system similar to the exhaust system of the aforementioned embodiments is connected to the exhaust port 331.

Figure 12:
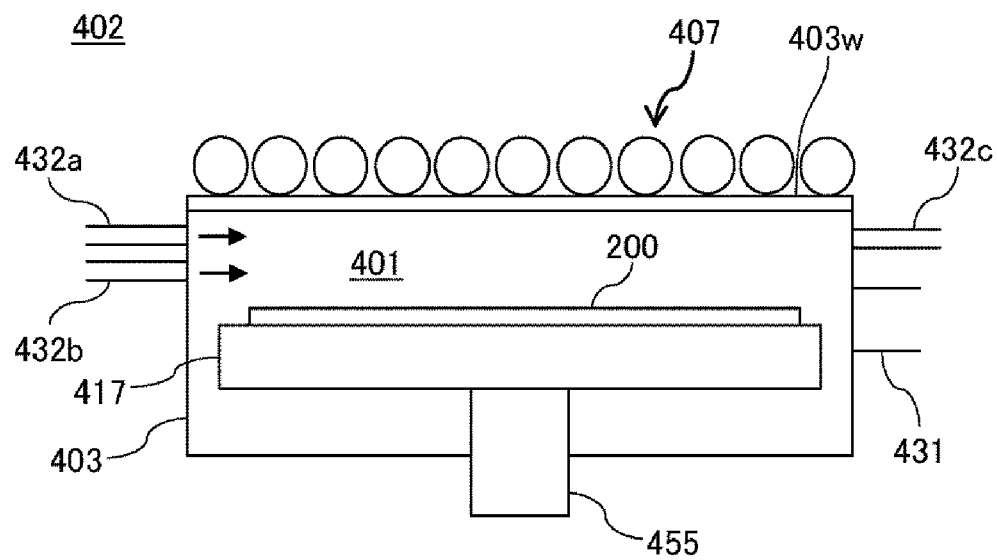
FIG. 12 is a schematic configuration diagram of a processing furnace of a substrate processing apparatus suitably used in another embodiment of the present disclosure, in which the portion of the processing furnace is shown in a vertical cross sectional view.

In addition, the present disclosure may be suitably applied to, e.g., a case where a film is formed using a substrate processing apparatus provided with a processing furnace 402 illustrated in FIG. 12. The processing furnace 402 includes a process vessel 403 which forms a process chamber 401, a support table 417 configured to horizontally support one or more wafers 200, a rotary shaft 455 configured to support the support table 417 from below, a lamp heater 407 configured to irradiate light toward the wafers 200 disposed in the process vessel 403, and a quartz window 403w which transmits the light irradiated from the lamp heater 407. Gas supply ports 432a to 432c are connected to the process vessel 403. A gas supply system similar to the precursor gas supply system and the modifying gas supply system of the aforementioned embodiments is connected to the gas supply port 432a. A gas supply system similar to the reaction gas supply system of the aforementioned embodiments are connected to the gas supply port 432b. A gas supply system similar to the catalyst gas supply system of the aforementioned embodiments is connected to the gas supply port 432c. An exhaust port 431 configured to exhaust the interior of the process chamber 401 is installed in the process vessel 403. An exhaust system similar to the exhaust system of the aforementioned embodiments is connected to the exhaust port 431.

In the case of using these substrate processing apparatuses, a film-forming process may be performed by the processing procedures and processing conditions similar to those of the aforementioned embodiments. Effects similar to those of the aforementioned embodiments may be achieved.

(1) The aforementioned embodiments may be appropriately combined with one another. At this time, the processing procedures and processing conditions may be similar to, for example, the processing procedures and processing conditions of the aforementioned embodiments.

EXAMPLES

Hereinafter, experimental results that support the effects acquired in the embodiments and modifications described above will be described.

First, the following samples 1 to 4 were produced as evaluation samples.

<Sample 1>

A plurality of samples 1 in which an SiOC film was formed on a surface of a wafer were produced using the substrate processing apparatus of the aforementioned embodiments. A film-forming process of forming the SiOC film on the surface of the wafer was carried out by performing a step of supplying a DSB gas and a $BCl_3$ gas into the process chamber accommodating the wafer and confining them in the process chamber, and a step of exhausting the interior of the process chamber, a predetermined number of times, to form an SiC film on the wafer and subsequently oxidizing the SiC film with an $H_2O$ gas. The processing conditions of the film-forming process were set to fall within the range of the processing conditions described in the aforementioned embodiments.

<Sample 2>

Sample 2 was produced by performing a process of supplying an $NF_3$ gas into the process chamber accommodating the wafer of sample 1 under predetermined processing conditions. In the process of supplying the $NF_3$ gas, the temperature of the wafer was set to fall within a range of 350 to 400 degrees C., and the internal pressure of the process chamber was set to fall within a range of 80 to 120 Torr. Other processing conditions were set to fall within the range of the processing conditions described in the first embodiment.

<Sample 3>

Sample 3 was produced by performing a process of supplying an $F_2$ gas into the process chamber accommodating the wafer of sample 1 under predetermined processing conditions. In the process of supplying the $F_2$ gas, the temperature of the wafer was set to fall within a range of 40 to 60 degrees C., and the internal pressure of the process chamber was set to fall within a range of 0.50 to 1.5 Torr. Other processing conditions were set to fall within the range of the processing conditions described in the second embodiment.

<Sample 4>

Sample 4 was produced by performing a process of supplying an $NF_3$ gas into the process chamber accommodating the wafer of sample 1 under predetermined processing conditions. In the process of supplying the $NF_3$ gas, the internal pressure of the process chamber was set to fall within a range of 10 to 20 Torr. Other processing conditions were set to be similar to the processing conditions at the time of producing sample 2 described above.

Subsequently, ion sputtering and X-ray photoelectron spectroscopy (XPS) analysis were alternately repeated on the films formed in samples 1 to 4, and the composition distributions (profiles) in the depth direction of the films were measured. FIGS. 7 to 10 are diagrams showing XPS analysis results of the films formed in samples 1 to 4, respectively. In FIGS. 7 to 10, the horizontal axis shows a sputtering time (minutes), which is the same meaning as the depth from the surface of the film formed on the wafer. In addition, in FIGS. 7 to 10, the vertical axis shows atomic concentrations (at %) of various elements (Si, O, C, F, and the like) contained in the film formed on the wafer.

Figure 7:
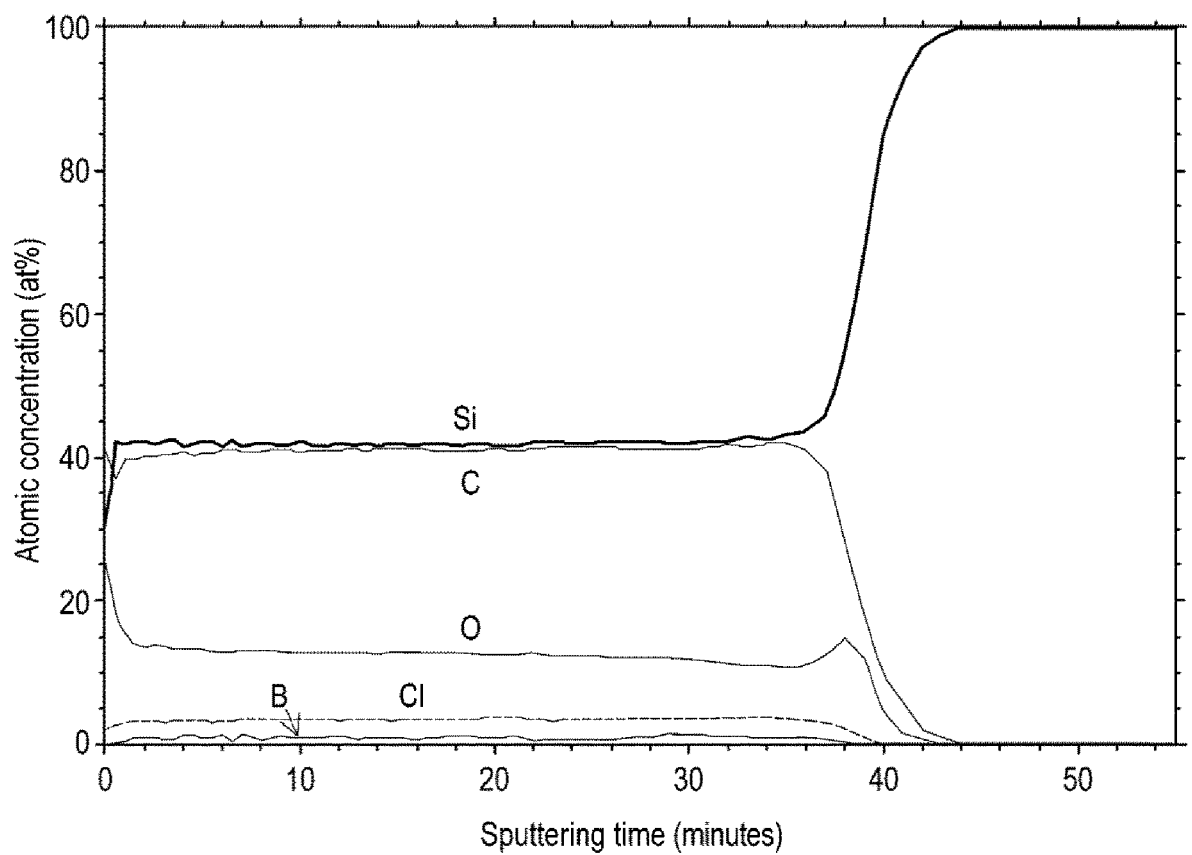
FIG. 7 is a diagram illustrating an XPS evaluation result of a film prior to performing a modification process.

From FIG. 7, it can be seen that the film formed in sample 1, i.e., the film prior to performing the process of supplying the $NF_3$ gas or the $F_2$ gas, became an F-free film containing Si, O and C, i.e., an SiOC film. Furthermore, it can be considered that B or Cl contained in the film was contained in the $BCl_3$ gas used in the film-forming process, but both of them are impurity levels.

Figure 8:
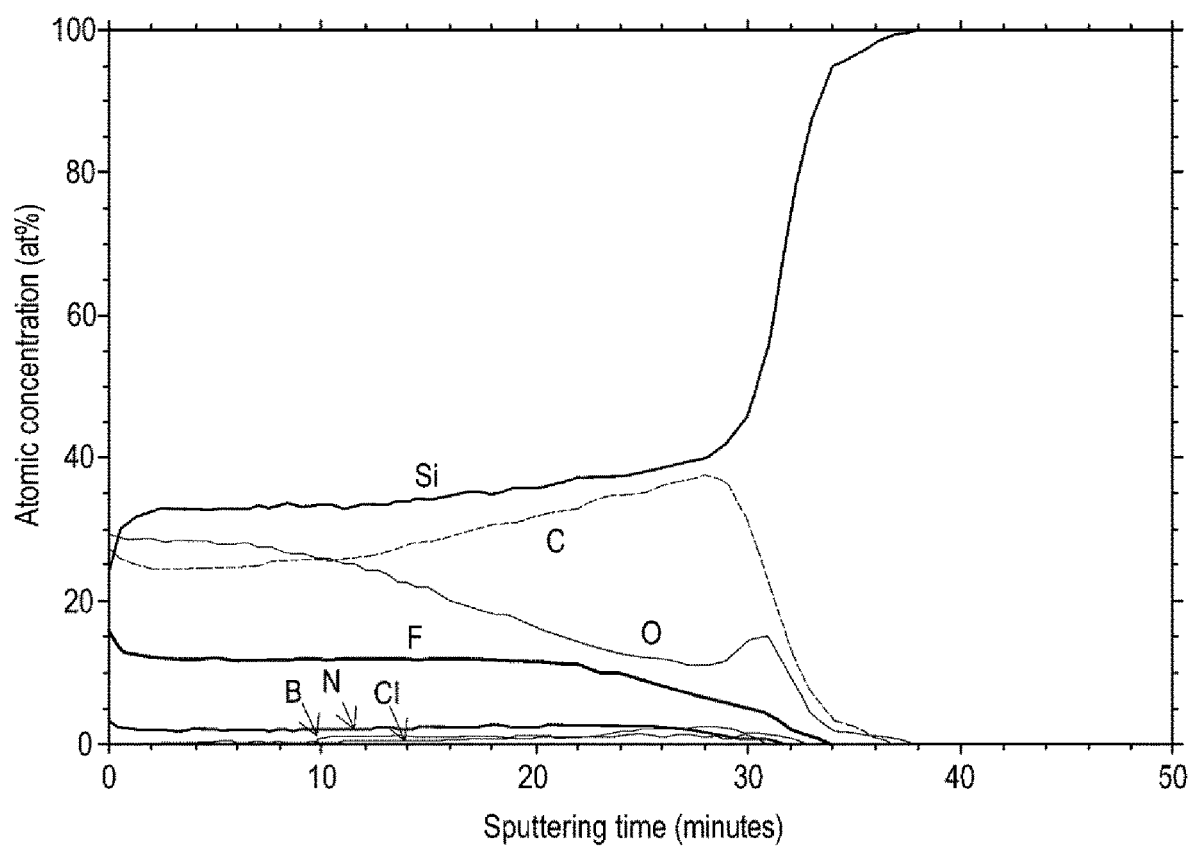
FIG. 8 is a diagram illustrating an XPS evaluation result of a film after performing a modification process under a predetermined condition.

From FIG. 8, it can be seen that the film formed in sample 2 is entirely modified from the SiOC film into the SiOCF film. That is, it can be known that F is widely doped not only on the surface but also in other regions (regions except for the surface of the film) in the film. In addition, it can be known that most of Si and C remain in the film almost without desorption.

Figure 9:
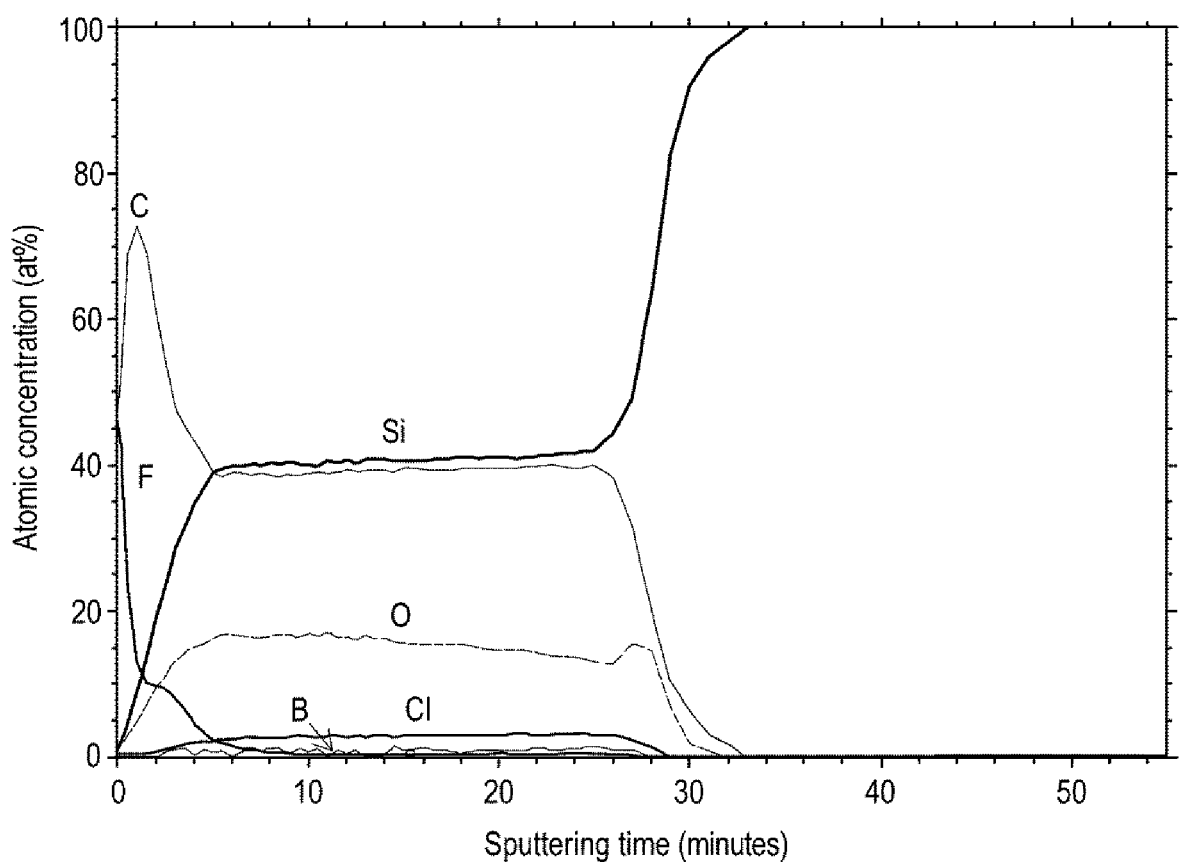
FIG. 9 is a diagram illustrating an XPS evaluation result of a film after performing a modification process under a predetermined condition.

From FIG. 9, it can be seen that only the surface of the film formed in sample 3 is modified into the CF layer. That is, it can be seen that the surface of the film is doped with F at a relatively high concentration and Si or O is desorbed from the surface of the film, whereby the C concentration on the film surface increases, so that the surface of the film becomes a layer containing C and F and not containing Si and O. In addition, it can be seen that there is no significant change in the composition in the regions except for the surface of the film, from the SiOC film formed in sample 1.

Figure 10:
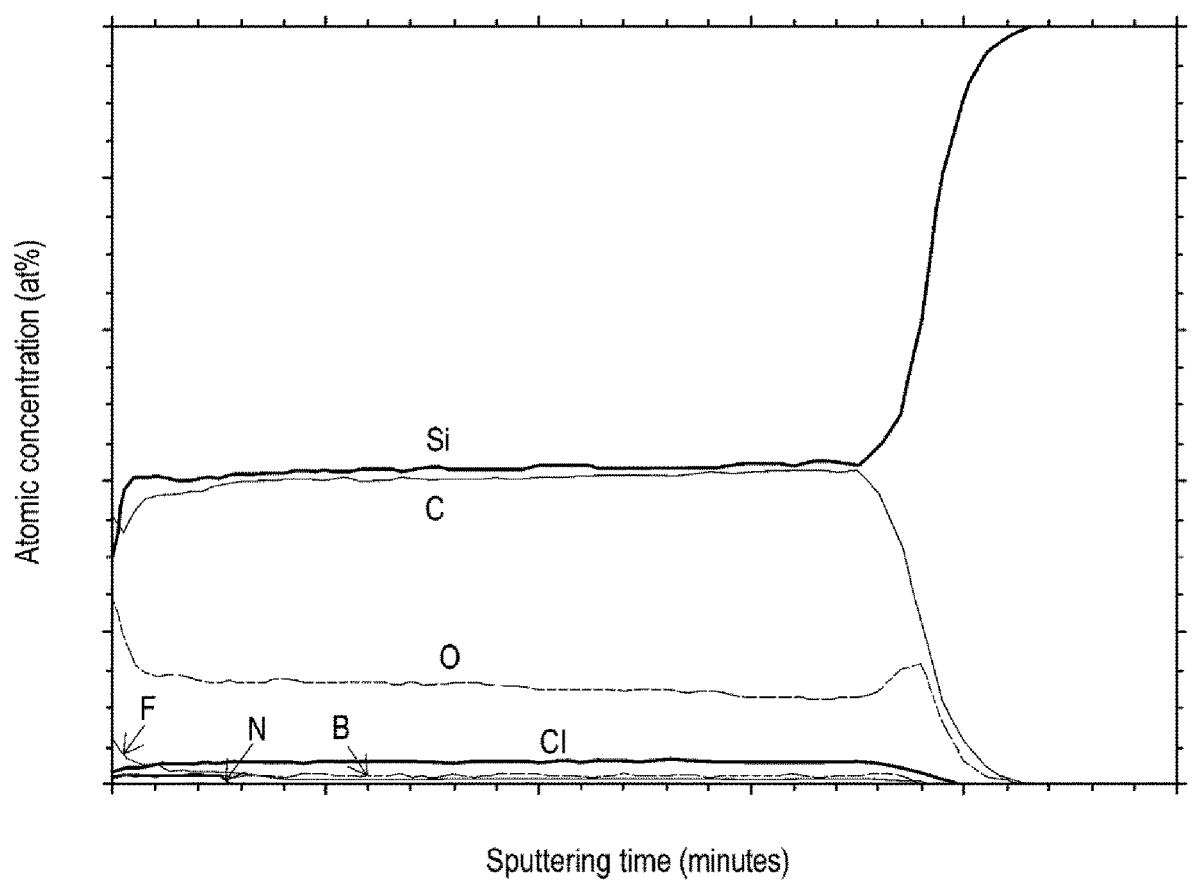
FIG. 10 is a diagram illustrating an XPS evaluation result of a film after performing a modification process under a predetermined condition.

From FIG. 10, it can be seen that the F concentration in the film formed in sample 4 is at the impurity level, specifically 5% or less in the surface, and 1% or less in the other regions. Moreover, it can be known that there is no significant change in the composition between the film formed in sample 4 and the film formed in sample 1. Therefore, in the process of supplying the $NF_3$ gas, it can be known that it is difficult to modify the SiOC film when the internal pressure of the process chamber is lowered to 10 to 20 Torr.

The processing conditions at the time of producing sample 2 and the processing conditions at the time of producing sample 4 are the same except for the internal pressure of the process chamber at the time of supplying the $NF_3$ gas. The reason for a large difference in the effects of the modification process in these samples may be considered as follows.

First, when producing sample 2, it is considered that, by increasing the internal pressure of the process chamber, i.e., the partial pressure of the $NF_3$ gas, the concentration of the $NF_3$ gas is increased, whereby the number of collisions of $NF_3$ molecules on the surface of the SiOC film (collision probability), i.e., the reaction probability between $NF_3$ and the SiOC film increases, so that diffusion of F into the film positively occurs. On the other hand, when producing sample 4, it is considered that the concentration of the $NF_3$ gas is lowered because the internal pressure of the process chamber, i.e., the partial pressure of the $NF_3$ gas is low, whereby the number of collisions of $NF_3$ molecules on the surface of the SiOC film, i.e., the reaction probability between NF$_3$ and the SiOC film decreases, so that it is difficult for the diffusion of F into the film to occur.

Furthermore, when producing sample 2, it is considered that, by increasing the internal pressure of the process chamber, i.e., the partial pressure of the NF$_3$ gas, the reaction energy of NF$_3$ gas molecules can be increased, whereby the formation of C—F bonds in the film is promoted. On the other hand, when producing sample 4, it is considered that the reaction energy of the NF$_3$ gas molecules is insufficient because the internal pressure of the process chamber, i.e., the partial pressure of the NF$_3$ gas is low, whereby it becomes difficult for the formation of C—F bonds in the film to proceed.

The present inventors have confirmed that the films formed by samples 2 and 3 are higher in etching resistance and lower in dielectric constant than the films formed by samples 1 and 4.

According to the present disclosure in some embodiments, it is possible to improve the quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   (a) providing a substrate having a film containing a predetermined element, oxygen and carbon formed on a surface of the substrate;
   (b) modifying a surface of the film by supplying a carbon-free fluorine-based gas to the substrate under a condition in which etching of the film does not occur; and,
   wherein the surface of the film is modified into a layer containing carbon and fluorine and not containing the predetermined element and oxygen, in (b).

2. The method of claim 1, wherein at least one selected from a group consisting of a fluorine gas, an iodine fluoride gas, a chlorine fluoride gas, and a hydrogen fluoride gas is used as the fluorine-based gas, in (b).

3. The method of claim 1, wherein a temperature of the substrate is set to fall within a range of a room temperature or higher to 100 degrees C. or lower, in (b).

4. The method of claim 1, wherein a pressure of a space where the substrate is located is set to fall within a range of 0.1 Torr or higher to 10 Torr or lower, in (b).

5. The method of claim 1, wherein a recess is formed on the surface of the substrate, and the film is formed at least in the recess.

6. The method of claim 1, further comprising (c) forming the film on the substrate by non-simultaneously supplying plural kinds of processing gases to the substrate.

7. The method of claim 6, wherein (c) and (b) are performed in-situ.

8. The method of claim 6, wherein (c) and (b) are performed ex-situ.

9. The method of claim 1, wherein (b) is performed under a non-plasma atmosphere.

10. The method of claim 1, wherein a temperature of the substrate is set to fall within a range of room temperature or higher to 50 degrees C. or lower, in (b).

11. The method of claim 1, wherein a pressure of a space where the substrate is located is set to fall within a range of 0.5 Torr or higher to 1 Torr or lower, in (b).

12. A non-transitory computer-readable recording medium storing a program that causes a computer to perform a process, the process comprising:
   (a) providing a substrate having a film containing a predetermined element, oxygen and carbon formed on a surface of the surface;
   (b) modifying a surface of the film by supplying a carbon-free fluorine-based gas to the substrate under a condition in which etching of the film does not occur; and,
   wherein the surface of the film is modified into a layer containing carbon and fluorine and not containing the predetermined element and oxygen, in (b).

13. The method of claim 1, wherein the predetermined element and oxygen are desorbed from the surface of the film, in (b).

14. The method of claim 1, wherein the film containing the predetermined element, oxygen and carbon is formed such that the surface of the film is modified into the layer containing carbon and fluorine and not containing the predetermined element and oxygen by (b).

15. The method of claim 1, wherein the film containing the predetermined element, oxygen and carbon is a SiOC film, and
   wherein the layer containing carbon and fluorine and not containing the predetermined element and oxygen is a CF layer.

16. The method of claim 1, wherein the film containing the predetermined element, oxygen and carbon is an oxycarbonitride film containing the predetermined element, and
   wherein the layer containing carbon and fluorine and not containing the predetermined element and oxygen is a fluorocarbon layer.

17. The method of claim 1, wherein the film containing the predetermined element, oxygen and carbon is a SiOCN film, and
   wherein the layer containing carbon and fluorine and not containing the predetermined element and oxygen is a CF layer.

* * * * *